(12) United States Patent
Miller et al.

(10) Patent No.: US 9,697,724 B2
(45) Date of Patent: Jul. 4, 2017

(54) TRANSMISSION LINE MEASURING DEVICE AND METHOD FOR CONNECTIVITY AND MONITORING

(75) Inventors: Gary Miller, Kearneysville, WV (US); Bernard Crutcher, Londonderry, NH (US); Peter Waltz, Bristol, NH (US); Christopher Chadbourne, Nashua, NH (US)

(73) Assignee: Hubbell Incorporated, Shelton, CT (US)

( * ) Notice: Subject to any disclaimer, the term of this patent is extended or adjusted under 35 U.S.C. 154(b) by 426 days.

(21) Appl. No.: 13/825,451

(22) PCT Filed: Sep. 22, 2011

(86) PCT No.: PCT/US2011/001632
§ 371 (c)(1),
(2), (4) Date: Jun. 4, 2013

(87) PCT Pub. No.: WO2012/039767
PCT Pub. Date: Mar. 29, 2012

(65) Prior Publication Data
US 2014/0145858 A1    May 29, 2014

Related U.S. Application Data

(60) Provisional application No. 61/385,320, filed on Sep. 22, 2010.

(51) Int. Cl.
*G08C 17/02* (2006.01)
*H04Q 9/00* (2006.01)
(Continued)

(52) U.S. Cl.
CPC .............. *G08C 17/02* (2013.01); *H04Q 9/00* (2013.01); *G01R 1/22* (2013.01); *G01R 15/142* (2013.01); *H04Q 2209/40* (2013.01)

(58) Field of Classification Search
CPC ........ G01R 15/142; G01R 1/22; G01K 1/024; H01R 4/186; Y02E 60/74; Y02E 60/727;
(Continued)

(56) References Cited

U.S. PATENT DOCUMENTS 1,924,793 A    8/1933    Laske
3,354,517 A    11/1967    Levinsky
(Continued)

FOREIGN PATENT DOCUMENTS

CN    101483567 A    7/2009
DE    10244304 B3    3/2004
(Continued)

OTHER PUBLICATIONS

"Transmission Line Security monitor can help protect nation's power gird", (Idahonational Laboratory): https://inlportal.inl.gov/portal/server.pt?open=514&objID=1269&mode=2&featurestory=DA_128177, 2009, 2 pgs.
(Continued)

*Primary Examiner* — Orlando Bousono
(74) *Attorney, Agent, or Firm* — Dickinson Wright PLLC

(57) ABSTRACT

A method for connecting low power radios into a self-assembling and self-healing network with multiple portals to higher speed networks such as, but not limited to, electrical or optical Ethernet is provided for monitoring transmission lines, for example. A clamp or other device is provided that includes an integral or associated current transformer and associated circuitry with design elements to address high temperature operation or other operating parameters. An arrangement of sensors is provided (e.g., sensors can be associated with clamps or positioned along infrastructure being monitored and without dependence on any clamps or other devices) that are designed to communicate and operate in an geographically distributed array to provide increased
(Continued)

and autonomous monitoring of large utility, highway, communication and similar networks. A unique collection of sensors (e.g., an anemometer with no moving parts) provides comprehensive diagnostics for improved operation of large geographic scale utility, highway, communication and similar infrastructure.

18 Claims, 18 Drawing Sheets

(51) Int. Cl.
  *G01R 1/22* (2006.01)
  *G01R 15/14* (2006.01)
(58) Field of Classification Search
  CPC ...... G08C 17/02; H04Q 9/00; H04Q 2209/40; H01L 2924/00014; H02J 13/0075
  See application file for complete search history.

(56) References Cited

U.S. PATENT DOCUMENTS

| | | | |
|---|---|---|---|
| 3,388,590 A | 6/1968 | Dryden | |
| 3,488,586 A | 1/1970 | Watrous et al. | |
| 3,771,356 A | 11/1973 | Mitchell et al. | |
| 3,991,366 A | 11/1976 | Schweitzer, Jr. | |
| 4,027,939 A | 6/1977 | White | |
| 4,170,190 A | 10/1979 | Warner | |
| 4,183,686 A | 1/1980 | De France | |
| 4,268,818 A | 5/1981 | Davis et al. | |
| 4,350,843 A | 9/1982 | Campbell et al. | |
| 4,384,289 A | 5/1983 | Stillwell et al. | |
| 4,470,711 A | 9/1984 | Brzozowski | |
| 4,689,752 A * | 8/1987 | Fernandes et al. | 700/292 |
| 4,714,893 A * | 12/1987 | Smith-Vaniz et al. | 324/126 |
| 4,723,220 A * | 2/1988 | Smith-Vaniz | 702/62 |
| 4,728,887 A * | 3/1988 | Davis | 324/127 |
| 4,746,241 A | 5/1988 | Burbank, III | |
| 4,794,328 A * | 12/1988 | Fernandes et al. | 324/127 |
| 4,796,027 A * | 1/1989 | Smith-Vaniz | 340/870.03 |
| 4,799,005 A | 1/1989 | Fernandes | |
| 4,806,855 A * | 2/1989 | Davis | 324/127 |
| 4,821,138 A | 4/1989 | Nakano et al. | |
| 4,829,298 A | 5/1989 | Fernandes | |
| 4,886,980 A | 12/1989 | Fernandes et al. | |
| 4,891,250 A | 1/1990 | Weibe et al. | |
| 5,036,164 A | 7/1991 | Schrader et al. | |
| 5,103,068 A | 4/1992 | Schrader | |
| 5,107,202 A | 4/1992 | Renda | |
| 5,162,615 A | 11/1992 | Schrader et al. | |
| 5,181,026 A | 1/1993 | Granville | |
| 5,188,542 A | 2/1993 | Ballman | |
| 5,200,576 A | 4/1993 | Schrader et al. | |
| 5,221,074 A | 6/1993 | Saracini | |
| 5,240,441 A | 8/1993 | Laricchia et al. | |
| 5,255,150 A | 10/1993 | Young et al. | |
| 5,341,088 A * | 8/1994 | Davis | 324/106 |
| 5,426,360 A * | 6/1995 | Maraio et al. | 324/126 |
| 5,552,564 A | 9/1996 | Schrader et al. | |
| 5,565,783 A | 10/1996 | Lau et al. | |
| 5,567,175 A | 10/1996 | Warden et al. | |
| 5,656,931 A | 8/1997 | Lau et al. | |
| 5,748,095 A | 5/1998 | Horstmann | |
| 5,786,626 A | 7/1998 | Brady et al. | |
| 5,862,589 A | 1/1999 | Chadbourne et al. | |
| 5,986,276 A | 11/1999 | Labriola, II | |
| 6,005,484 A | 12/1999 | Ko | |
| 6,093,064 A | 7/2000 | Callen | |
| 6,114,941 A | 9/2000 | Scott | |
| 6,167,525 A | 12/2000 | Donazzi et al. | |
| 6,377,184 B1 | 4/2002 | Minker | |
| 6,412,977 B1 | 7/2002 | Black et al. | |
| 6,525,270 B1 | 2/2003 | Connor et al. | |
| 6,538,204 B2 | 3/2003 | Connor | |
| 6,552,271 B2 | 4/2003 | Connor et al. | |
| 6,764,347 B1 | 7/2004 | Plishner | |
| 6,784,802 B1 | 8/2004 | Stanescu | |
| 6,818,830 B2 | 11/2004 | O'Grady et al. | |
| 6,846,989 B2 | 1/2005 | Sokol et al. | |
| 7,053,770 B2 | 5/2006 | Ratiu et al. | |
| 7,265,533 B2 | 9/2007 | Lightbody et al. | |
| 7,282,944 B2 | 10/2007 | Gunn et al. | |
| 7,295,133 B1 * | 11/2007 | McCollough, Jr. | 340/870.07 |
| 7,304,976 B2 | 12/2007 | Mao et al. | |
| 7,337,080 B2 | 2/2008 | Doig et al. | |
| 7,348,489 B2 | 3/2008 | Chadbourne | |
| 7,369,045 B2 | 5/2008 | Hansen | |
| 7,430,932 B2 | 10/2008 | Mekhanoshin et al. | |
| 7,626,489 B2 | 12/2009 | Berkman et al. | |
| 7,746,241 B2 | 6/2010 | Feight et al. | |
| 7,786,894 B2 | 8/2010 | Polk et al. | |
| 7,808,774 B2 | 10/2010 | Tay et al. | |
| 7,882,629 B2 | 2/2011 | Chadbourne | |
| 2004/0178925 A1 * | 9/2004 | Kawai et al. | 340/870.17 |
| 2005/0017751 A1 * | 1/2005 | Gunn et al. | 324/771 |
| 2005/0040809 A1 | 2/2005 | Uber, III et al. | |
| 2005/0169056 A1 * | 8/2005 | Berkman et al. | 365/185.22 |
| 2005/0242086 A1 | 11/2005 | Imura et al. | |
| 2005/0285735 A1 | 12/2005 | Imura et al. | |
| 2006/0006987 A1 | 1/2006 | Hashimoto et al. | |
| 2006/0077918 A1 * | 4/2006 | Mao et al. | 370/310 |
| 2006/0148286 A1 * | 7/2006 | Hughes et al. | 439/92 |
| 2007/0141922 A1 | 6/2007 | Ross et al. | |
| 2008/0068212 A1 * | 3/2008 | Tay et al. | 340/870.02 |
| 2008/0077336 A1 | 3/2008 | Fernandes | |
| 2008/0200078 A1 | 8/2008 | Waltz et al. | |
| 2008/0231463 A1 | 9/2008 | Feight | |
| 2008/0246507 A1 * | 10/2008 | Gunn et al. | 324/771 |
| 2008/0284410 A1 * | 11/2008 | Perez | 324/120 |
| 2008/0284614 A1 * | 11/2008 | Perez et al. | 340/870.02 |
| 2008/0310069 A1 * | 12/2008 | Divan et al. | 361/93.9 |
| 2009/0015239 A1 * | 1/2009 | Georgiou et al. | 324/105 |
| 2009/0033513 A1 * | 2/2009 | Salsbury et al. | 340/825.2 |
| 2009/0074184 A1 * | 3/2009 | Baum et al. | 380/205 |
| 2009/0234945 A1 * | 9/2009 | Chande et al. | 709/224 |
| 2009/0240449 A1 | 9/2009 | Gibala et al. | |
| 2009/0243876 A1 * | 10/2009 | Lilien et al. | 340/870.01 |
| 2009/0257296 A1 * | 10/2009 | Ong et al. | 365/200 |
| 2009/0261767 A1 * | 10/2009 | Butler et al. | 318/445 |
| 2009/0281673 A1 | 11/2009 | Taft | |
| 2010/0013457 A1 | 1/2010 | Nero, Jr. | |
| 2010/0033345 A1 | 2/2010 | Polk et al. | |
| 2010/0045447 A1 | 2/2010 | Mollenkopf et al. | |
| 2010/0084920 A1 * | 4/2010 | Banting et al. | 307/66 |
| 2010/0085036 A1 * | 4/2010 | Banting et al. | 324/127 |
| 2010/0109848 A1 * | 5/2010 | Blair et al. | 340/10.2 |
| 2010/0151735 A1 | 6/2010 | Crutcher et al. | |

FOREIGN PATENT DOCUMENTS

| | | |
|---|---|---|
| JP | 09-233679 A | 9/1997 |
| JP | 11-313090 A | 11/1999 |

OTHER PUBLICATIONS

"Automatic Dead Ends for ACSR, AAAC & AAC Conductors", Hubbell/Fargo Mfg. Company, Inc., Aug. 1997, 8 pgs.

* cited by examiner

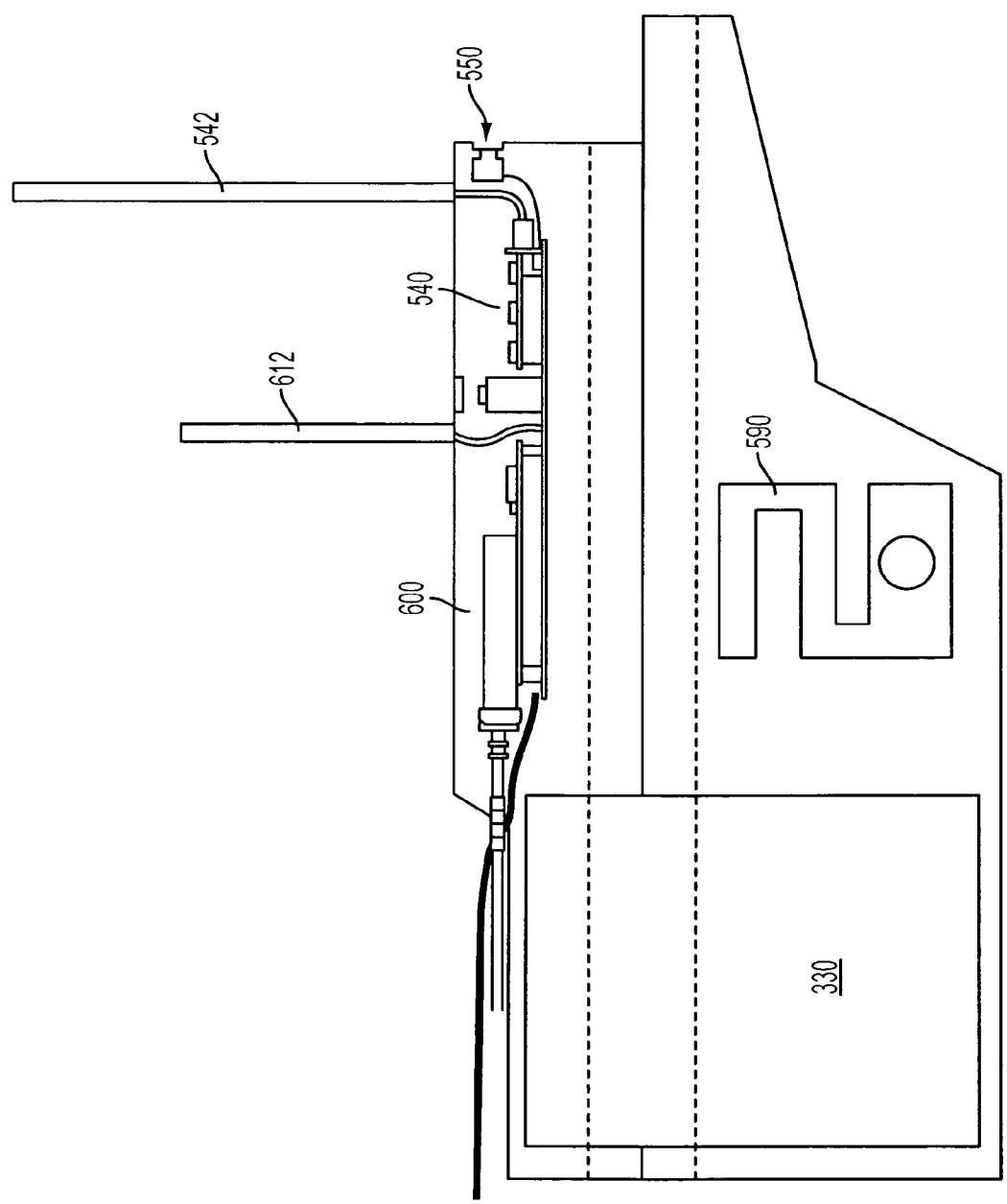

DASC Data Page

DASC

| DASC Home | | | | | | |
|---|---|---|---|---|---|---|
| > DASC Display Page | Date | Time | Maximum Ambient Temp | Minimum Ambient Temp | Maximum Wind Speed | Minimum Wind Speed |
| DASC List | 01-01-2011 | 00:55:00 | 22.2 | 22.1 | 0.1 | 0.1 |
| DASC Map | 01-01-2011 | 00:54:00 | 22.2 | 22.1 | 0.1 | 0.1 |
| Alerts | 01-01-2011 | 00:53:00 | 22.2 | 22.1 | 0.1 | 0.1 |
| Logs | | | | | | |

| Date | Time | Maximum Current | Minimum Current | Number of Corona Event(s) | Duration of Corona Event(s) |
|---|---|---|---|---|---|
| 01-01-2011 | 00:55:00 | 416.9 | 416.7 | 0 | 0 |
| 01-01-2011 | 00:54:00 | 416.9 | 416.7 | 0 | 0 |
| 01-01-2011 | 00:53:00 | 416.9 | 416.7 | 0 | 0 |

| Date | Time | Maximum Wire Temperature | Minimum Wire Temperature | Maximum Vibration | Minimum Vibration |
|---|---|---|---|---|---|
| 01-01-2011 | 00:55:00 | 26.2 | 26.1 | 47364.0 | 0.0 |
| 01-01-2011 | 00:54:00 | 26.2 | 26.1 | 47364.0 | 0.0 |
| 01-01-2011 | 00:53:00 | 26.3 | 26.1 | 47364.0 | 0.0 |

| Date | Time | Number of Impulse Events | Number of Tilt Events | Number of Surge Event(s) | Tilt Duration |
|---|---|---|---|---|---|
| 01-01-2011 | 00:55:00 | 0 | 0 | 0 | 0 |
| 01-01-2011 | 00:54:00 | 0 | 0 | 0 | 0 |
| 01-01-2011 | 00:53:00 | 0 | 0 | 0 | 0 |

IP Address:

FIG. 17

TRANSMISSION LINE MEASURING DEVICE AND METHOD FOR CONNECTIVITY AND MONITORING

This application is a national stage application which is based on PCT Application No. PCT/US2011/01632, filed Sep. 22, 2011, which claims priority to U.S. Provisional Patent Application Ser. No. 61/385,320, filed Sep. 22, 2010; the entire contents of each application being incorporated herein by reference.

FIELD OF THE INVENTION

The present application relates to data collecting and, more particularly, to a connector (e.g., data acquisition suspension clamp) for an electrical conductor or other transmission line (e.g., a power transmission line, a communications line, a gas line, a water line, an oil line, a railroad, a highway, among others that are deployed over geographic distances) which collects data and reports measured conditions of the conductor or transmission line to a monitoring device or systems. However, illustrative embodiments of the present invention need not be restricted to use as part of a clamp. For example, embodiments of the present invention can be implemented at a location next to a clamp or implemented without dependence upon any clamp or other device.

BACKGROUND OF THE INVENTION

Power Grids

FIGS. 1-4 illustrate related art disclosed in U.S. Pat. No. 8,002,592. FIG. 1 shows a transmission tower 200 which is used to suspend power transmission lines 202 above the ground. The tower 200 has cantilevered arms 204. Insulators 206 extend down from the arms 204. One or more suspension clamps 208 are located at the bottom ends of the insulators 206. The lines 202 are connected to the suspension clamps. The clamps 208 hold the power transmission lines 202 onto the insulator 206.

FIGS. 2-4 illustrate an example embodiment of the suspension clamp 208 which generally comprises an upper section 210 and a lower support section 212. These two sections 210, 212 each contain a body 214, 216 which form a suspension case. The bodies 214, 216 each comprise a longitudinal trough (or conductor receiving area) 215, 217 that allow the transmission conductor 202 to be securely seated within the two sections and when the two sections are bolted (or fastened) together by threaded fasteners 201 (not shown). This encases the transmission conductor 202 between the two bodies to securely contain the transmission conductor 202 on the clamp 208. Threaded fasteners are not required and any other suitable fastening configuration may be provided.

The two bodies 214, 216 connected together are suspended via a metal bracket 218 that attaches to the lower body 216 at points via bolt hardware 220.

The lower body, or lower body section, 216 comprise a first end 219 and a second end 221. The conductor receiving area (or conductor contact surface) 217 extends from the first end 219 to the second end 221 along a top side of the lower body 216. The conductor receiving area 217 forms a lower groove portion for contacting a lower half of the conductor 202. A general groove shape is not required, and any suitable configuration may be provided.

In one implementation, the upper and lower sections 210, 212 each have imbedded within their respective bodies 214, 216 one-half of a current transformer 222, 224 that is commonly referred to in the industry as a split core current transformer. When these components 222, 224 are joined, they form an electromagnetic circuit that allows, in some applications, the sensing of current passing through the conductor 202. In one implementation, the current transformer is used to power sensing, data collection, data analysis and data formatting devices. In some implementations the current transformer may be located outside of the clamp or similar device or, in some implementations, power may be provided by another means.

The body 214 of the upper section 210 contains a first member 232 and a second member 234 forming a cover plate. The first member 232 comprises a first end 233, a second end 235, and a middle section 237 between the first end 233 and the second end 235. The conductor receiving area (or conductor contact surface) 215 extends from the first end 233 to the second end 235 along a bottom side of the first member 232. The conductor receiving area 215 forms an upper groove portion for contacting an upper half of the conductor 202. A general groove shape is not required, and any suitable configuration may be provided. In one implementation, the first member 232 further comprises a recessed cavity 226 at the middle section 237 that effectively contains an electronic circuit 228. In this implementation, the electronic circuit 228 is designed to accept inputs from several sensing components. This cavity 226 may be surrounded by a faraday cage 230 to effectively nullify the effects of high voltage EMF influence from the conductor 202 on the circuitry 228. The faraday cage may also surround the current transformer 222. The cover plate, or cover plate member, 234 can cover the top opening to the cavity 226 to retain the electronic circuit inside the body, or upper body section, 214. The electronics may be housed in a metal or plastic container, surrounded by the noted faraday cage, and the entire assembly can be potted, such as with epoxy for example.

The electronic circuit 228 can accept and quantify in a meaningful manner various inputs for monitoring various parameters of the conductor 202 and the surrounding environment. The inputs can also be derived from externally mounted electronic referencing devices/components. The inputs can include, for example: 1) Line Voltage reference (as derived from the faraday cage 230 or other means); 2) Line Current reference (as derived from the Current transformer 222, 224 or other means); 3) Barometric pressure and Temperature references—internal and ambient (as derived from internal and external thermocouples 236, 238 or other means); 4) Vibration references of the conductor (as derived from the accelerometer 240, such as a 10-150 KHz vibration sensor for example, or other means); and 5) Optical references (as derived from the photo transistor 242 in a fiber optic tube or other means). The optical reference portion may, for example, allow the clamp to look up and see flashes of light from corona if the insulator starts to fail, or lightening indication storm activity, and/or tensile references (as derived from the tension strain device 244 which may be included in certain implementations). The tensile references from the tensile indicators 244 may, for example, provide information indicating that ice is forming as the weight of the conductor increases due to ice build up.

Supervisory Control And Data Acquisition (SCADA) generally refers to an industrial control system such as a computer system monitoring and controlling a process. Information derived by the electrical/electronic circuitry can exit the circuit 228 via a non-conductive fiber optic cable 246 and be provided up and over to the transmission tower 200 and ultimately at the base of the tower and fed into the user's SCADA system to allow the end user to access and view electrical and environmental conditions at that sight, or the information can be transmitted to a remote or central site. This implementation, however, has proven to be problematic. For example, routing fiber to a clamp that is operating at very high voltage creates a voltage creep path that can cause an arc even though glass fiber and plastic sheath are provided as insulators. Arcs form along the boundary between the air and the solid insulator. If the insulator were just a simple rod, it would have to be 3 times longer. The suspension clamp or other sensing device may be alternatively configured to wirelessly transmit information from the electronic circuit 228 to a receiver system. However, this implementation has likewise been problematic due to the complexity of the software needed to accommodate the distances over which the clamps are used and the number of clamps being monitored.

Certain Problems can Occur in Current Grids

Transmission lines face numerous problems. Wind causes vibration which can gradually crack the wire or destroy it outright. Excessive heat may cause lines to sag into trees or traffic. Corroded wires will generate more heat when current passes through, but there is no way to know the extent of any corrosion since it is generally interior to the wire. Corona is a type of electrical discharge which will eat away at wire, insulators, and anything else in the vicinity. Ice buildup can break wire due to the weight. Trees may fall naturally over wires and pose a hazard if not trimmed. Natural and man-made disasters, such as earthquakes and forest fires can damage transmission power lines. In addition, wildlife, and squirrels in particular, can get carbonized when they crawl into certain components of a power grid, thereby causing disruption of power transmission via the power transmission lines. Line optimization to boost capacity is temperature dependent and can only be done via conservative estimates of local conditions.

Grid Monitoring

In conventional power grids, current and voltage are measured at substations. Current capacity of a line is estimated based on the wire diameter, age of the wire, the ambient temperature, and wind speed. However, due to many variables, it is an educated guess. In addition, there is no early warning with regard to ice build-up and ice is detected when a wire breaks during icing. Vibration dampers are routinely attached to the power lines to reduce vibration; however, their effectiveness is only estimated by how many lines break due to vibration stress, in spite of the dampers being present. The power lines can generate corona that can be heard as a sizzling sound and can also be seen by using special cameras that can see in the ultraviolet spectrum. However, such cameras are large and expensive. The cameras are generally sent to places where someone has heard a sizzling sound or where an insulator appears to be eaten away but may not be effective since corona can be intermittent and is affected by many environmental conditions such as moisture and air pressure. Further, most proposed telemonitoring devices require battery power. Battery power is not suitable in these applications that are elevated above ground and distributed over large geographic areas, making their maintenance untenable. In addition to powering challenges, existing monitoring devices are relatively expensive and large, which limits their use to occasional applications or installation to limited sites. As a result, there is no opportunity to gather widespread data and make determinations such as lightning location by way of triangulation or real-time power carrying capacity based upon full transmission line weather conditions.

Repair or Servicing a Transmission Line

Initially, one must locate where a power transmission line is broken. However, power transmission lines can run hundreds of miles between substations, and the only information generally available is that one substation is supplying power and the next one is not receiving the supplied power. Accessibility to power transmission lines may vary. In some cases, the power transmission lines may be accessible by motorized ground vehicles. In other cases, lines may only be accessible by helicopter, wherein a service technician must hang under the helicopter to service or repair a line. Such repairs or maintenance can be very expensive.

Communication Issues

In order to retrieve information about the system, rapid and secure communication is necessary. Radio communication via Ethernet is one option. However, organizing an Ethernet network requires the use of devices known as routers or switches. Each router or switch will look at an Ethernet packet of information and make note of the source address and the destination address as the packet arrives at a port. If the destination is known, the packet is forwarded to only one port which is known to be connected to that destination device. If it is not a known address, it is repeated to all ports except the port where it arrived. When the destination device responds, the source address will appear in a packet on a single port which permit the router or switch to learn where to send the next packet with that particular destination address.

There are specific protocols which optimize the route for delivering a packet and to remove the opportunity for a packet to become repeated in a loop in the network. Some of the more common protocols are Spanning Tree Protocol and Rapid Spanning Tree Protocol.

A popular radio protocol for packet-based transmission is Zigbee which is described in standard IEEE 802.15.4. It is intended for relatively small radio networks in a small geographic area. It is well suited to a single building or a property of several acres. However, when the radios become numerous and spread out over a large area, the system becomes unworkable. The most distant radio message must be repeated by coordinator elements (e.g., a more capable radio) until the destination is reached. Because there is a time limit for a reply, the physical dimensions of the network are limited.

Although devices exist for monitoring transmission lines, they face the powering, diagnostic and communication challenges noted above. There is a need for a system that allows for fast analysis of any actual or potential repair problems and power optimization capabilities along transmission lines (e.g., to permit, for example, increased peak loads based upon real operating conditions versus conservative estimates based upon worst case weather), with lower costs of repair, better preventative maintenance, and faster restore times. Further, there is a need for a simple way of communicating and collecting the substantial amount of data that can be accumulated by a wide-spread installation of sensing devices over large geographic areas.

SUMMARY OF THE INVENTION

Illustrative embodiments of the present invention address at least the above problems and/or disadvantages, and provide at least the advantages described below.

In according to illustrative embodiments of the present invention, a method of data collecting and a data acquisition device for an electrical conductor or other transmission line (e.g., a power transmission line, a communications line, a gas line, a water line, an oil line, a railroad, a highway, among others that are deployed over geographic distances) are provided to collect data and report measured conditions of the conductor or transmission line to a monitoring device (s) or system(s). The data acquisition device is illustrated in conjunction with a clamp; however, illustrative embodiments of the present invention need not be restricted to use as part of a clamp. For example, embodiments of the present invention can be implemented using a data acquisition device at a location next to a clamp or implemented without dependence upon any clamp or other connection device.

In accordance with illustrative embodiments of the present invention, a data acquisition device is implemented as a smart clamp that holds a transmission line conductor to a high voltage insulator. A split core current transformer in the center of the clamp or near the clamp harvests approximately 5 watts (W) to power measuring and sensor circuitry. The two halves of the split core current transformer are joined during clamp installation or during a separate installation process. Communication and sensor electronics (e.g., a GPS device and radio) are housed in a non-metallic enclosure on the side of the smart clamp. The non-metallic material facilitates proper radio and GPS operation. A "T-shaped" extension at the bottom of the enclosure houses ambient air temperature and wind speed detectors. Wind measurement is done without moving parts to help assure long-term reliability, and features unique two-stage technology to improve the accuracy of low-speed and high-speed wind velocity measurements. A smart grid can be implemented using a multi-hop short range radio system to relay information between data acquisition devices provided along the line to one or two ground-based adaptors that convert the information to a standard electrical or optical Ethernet interface. Each clamp's radio has an approximate line-of-sight range of about 1 mile and is operated in accordance with a protocol for participating in multi-hop short range radio communications. Each clamp is configured to send a message (e.g., a short e-mail message) to programmable e-mail addresses in case of events such as current surges, excessive conductor temperature, excessive vibration, corona, and the like to ensure rapid and intelligent response to serious conditions.

BRIEF DESCRIPTION OF THE DRAWINGS

The above and other exemplary features, aspects and advantages of the present invention will become more apparent from the following detailed description of certain exemplary embodiments thereof when taken in conjunction with the accompanying drawings in which:

FIG. 10 shows various components of a smart clamp constructed in accordance with an illustrative embodiment of the present invention;

FIGS. 16 and 17 are screen shots generated by an administrative system in accordance with an illustrative embodiment of the present invention.

Throughout the drawings, like reference numerals will be understood to refer to like elements, features and structures.

DETAILED DESCRIPTION OF ILLUSTRATIVE EMBODIMENTS

This description is provided to assist with a comprehensive understanding of illustrative embodiments of the present invention described with reference to the accompanying drawing figures. Accordingly, those of ordinary skill in the art will recognize that various changes and modifications of the illustrative embodiments described herein can be made without departing from the scope and spirit of the present invention. Also, descriptions of well-known functions and constructions are omitted for clarity and conciseness. Likewise, certain naming conventions, labels and terms as used in the context of the present disclosure are, as would be understood by skilled artisans, non-limiting and provided only for illustrative purposes to facilitate understanding of certain illustrative implementations of the embodiments of the present invention.

Data Acquisition Device Overview

FIGS. 5-17 illustrate illustrative embodiments of the present invention that provide for a method, system and apparatus for a smart grid comprising networked data acquisition devices that monitor transmission lines or conductors. The smart grid is illustrated using power transmission lines; however, it is to be understood that the data acquisition devices can be configured to monitor other types of transmission lines or conductors deployed over extensive geographic distances (e.g., a communications line, a gas line, a water line, an oil line, a railroad, a highway, among others), and need not be restricted to use only with connectors or clamps, in accordance with illustrative embodiments of the present invention. A data acquisition device is illustrated using a suspension clamp (e.g., on a power transmission line) that is hereinafter referred to as a "smart clamp." Data acquisition devices, however, are understood to be any related smart connectors or smart accessories or devices for data acquisition and networked monitoring.

Figure 5:
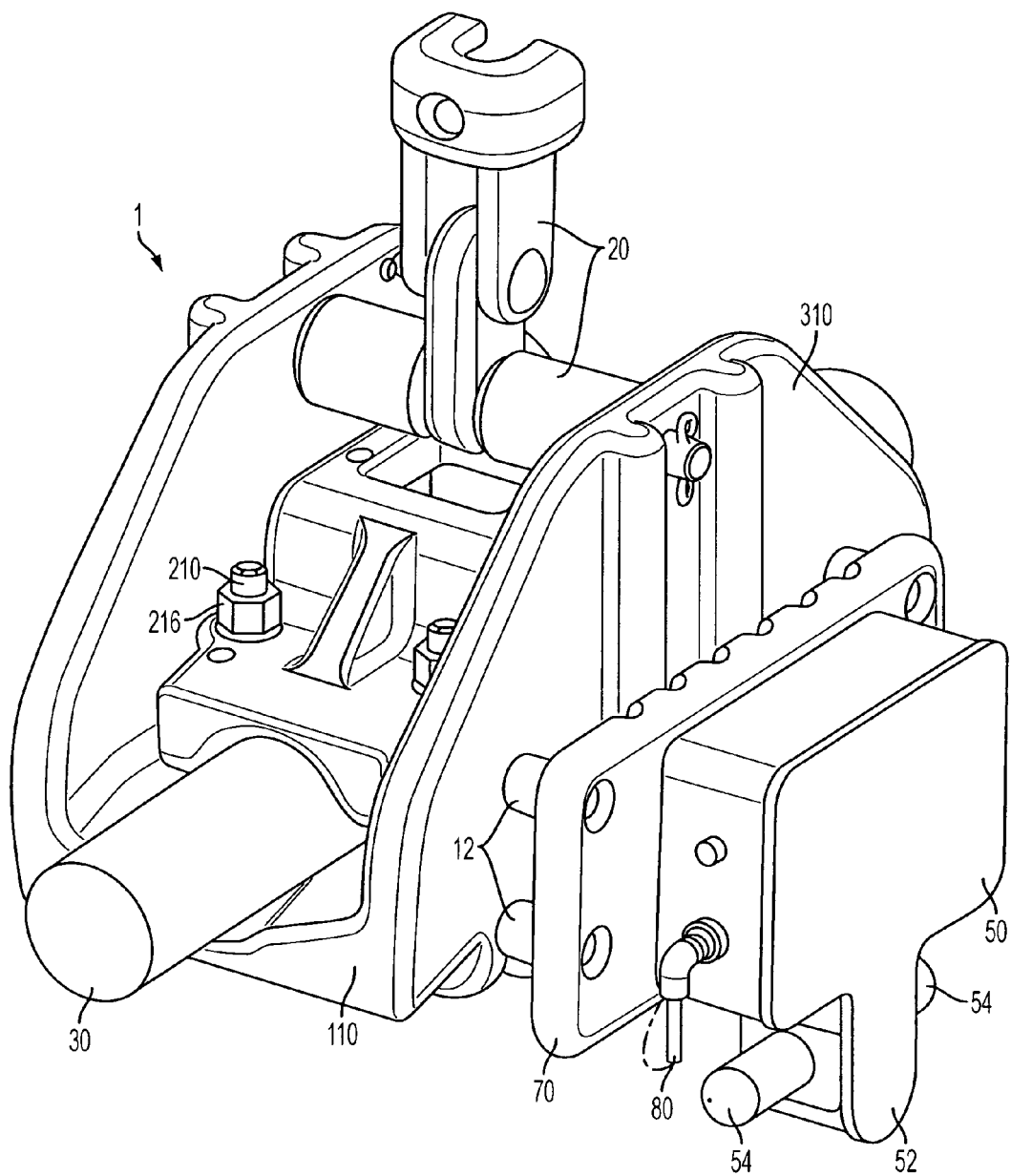
FIG. 5 is a perspective view of a smart clamp constructed in accordance with an illustrative embodiment of the present invention.

With reference to FIGS. 5-9, a smart clamp 1 is illustrated in FIG. 5. The smart clamp assembly includes a clamp body 110, a keeper body 310 resting on the clamp body 110, an electronics housing 50, and a heat shield 70 that protects the electronic components in the electronics housing 50. Also depicted are illustrative clamp hanger hardware 20 for affixing the clamp 1 to a power line or other conductor 30, for example, and a high temperature cable 80 to connect a power source (e.g., a power supply comprising a current transformer 330) to the electronics in the electronics housing 50 as described below.

Figure 6:
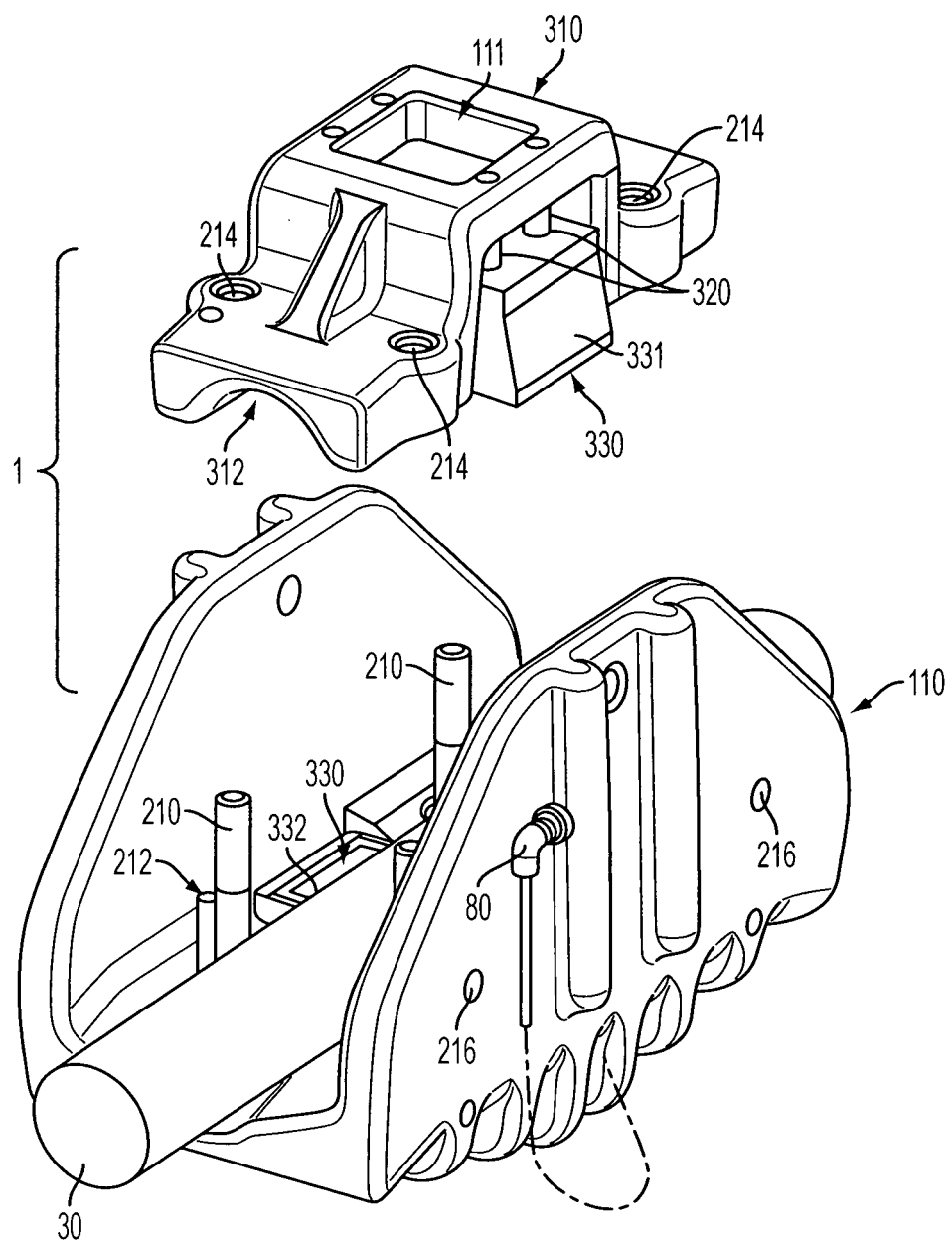
FIG. 6 is an exploded perspective view of the smart clamp of FIG. 5.
Figure 7:
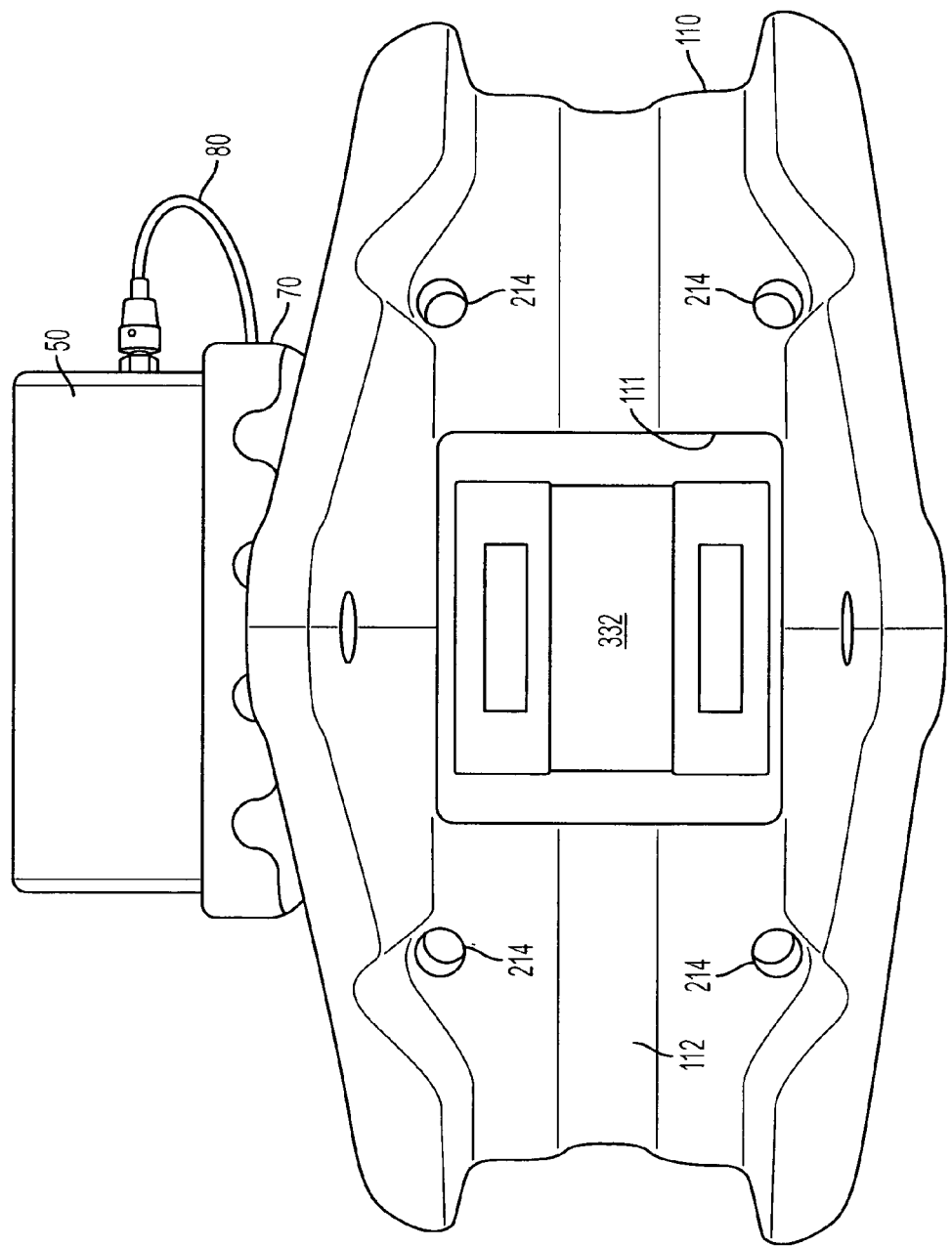
FIG. 7 is a top view of the clamp body of the smart clamp of FIG. 5.

As illustrated in FIGS. 5, 6 and 7, the clamp body 110 includes a central trough or channel 112 along its length on to which a power line/wire 30 is to be placed. The keeper body 310 likewise includes a central trough or channel 312 along its longitudinal length to accommodate the power line 30 such that, when the keeper body 310 and the clamp body 110 are attached, the power line 30 is secured between the two bodies 110, 310. Illustrative hardware for securing the keeper body 310 and the clamp body 110 to each other can include, but is not limited to, a U-bolt 210 inserted into bolt holes 214 and secured via nuts 216. A similar configuration of two bolts holes 214 and nuts 216 for a U-bolt 210 can be provided on opposite ends of the clamp 1.

Figure 8:
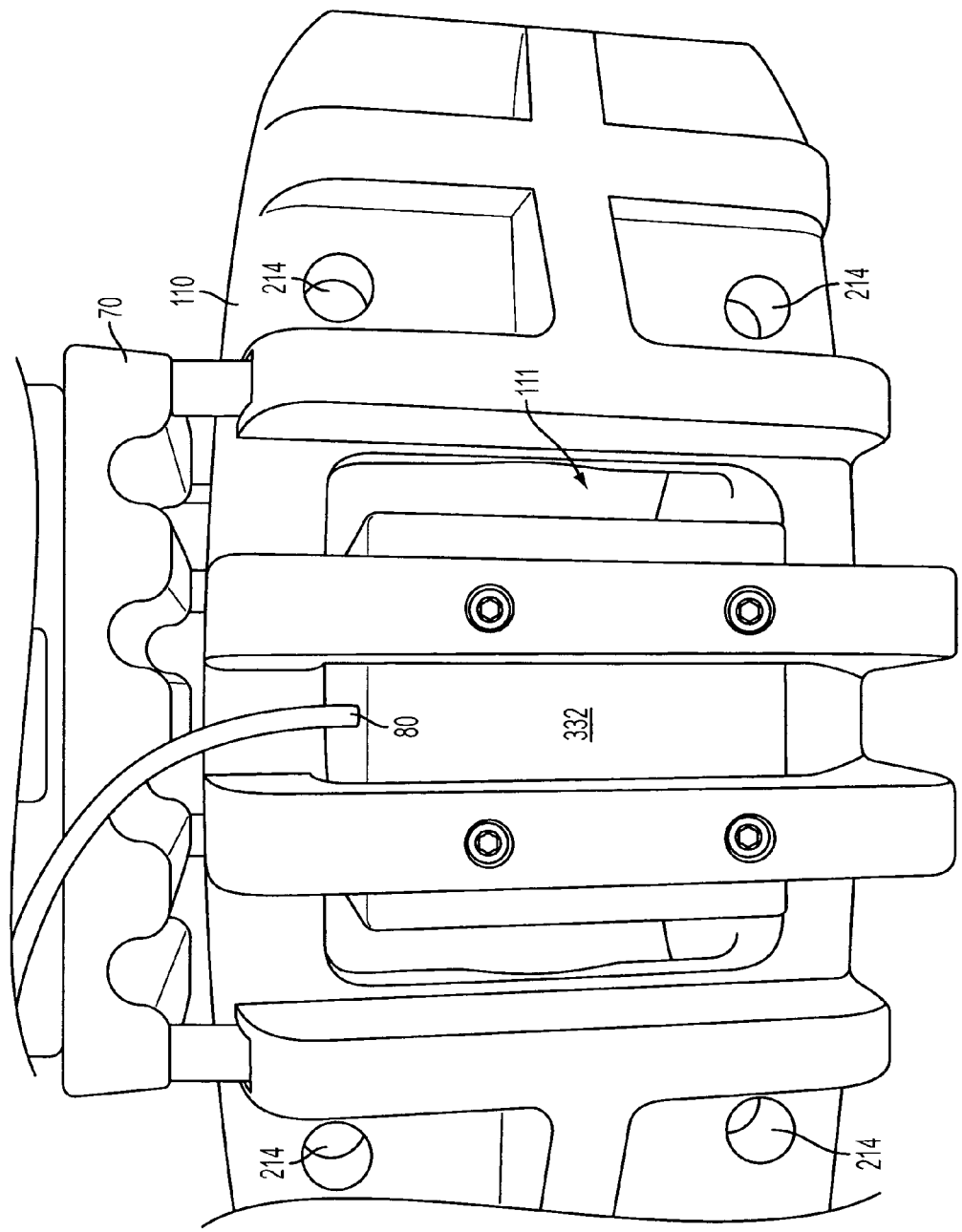
FIG. 8 is a bottom view of the smart clamp of FIG. 5.

The keeper body 310 includes a cooling chimney 111 as shown in FIGS. 5 and 6 to allow air to circulate and cool the smart clamp 1. The keeper body assembly comprises the keeper body 310, springs 320 and an upper portion 331 of the transformer 330. Similarly, as shown in FIG. 7, the clamp body 110 also includes a cooling chimney 111 that also facilitates air circulation to cool the smart clamp 1. Accordingly, the clamp body assembly comprises the clamp body 110 and lower portion 332 of the transformer 330. The upper and lower portions 331 and 332 of the transformer 330 in the power supply can be provided with troughs or channels similar to the channel 112 in the clamp body (e.g., as illustrated in the lower portion 332 of the transformer depicted in FIG. 7) to accommodate a conductor 30, and are positioned and secured in their respective keeper body 310 and clamp body 110 so as to be aligned to one another. When the clamp body 110 and the keeper body 310 are secured together, the springs 320 are loaded or compressed by the upper and lower portions of the transformer 330. The spring fitting of the current transformer 330 to the keeper body 310 allows for floating the conductor 30 within ranges to avoid over pressing the conductor yet provide good seal and minimize vibrations. While the illustrated embodiments depict the power supply assembly with current transformer 330 having portions 331 and 332 provided within the keeper body 310 and clamp body 110, respectively, it is to be understood that the current transformer 330 can be deployed in another location relative to the clamp 1. For example, portions 331 and 332 of the transformer 330 can be attached to the conductor via a clamp at a location adjacent to the clamp 1. The underside of the clamp body 110 is shown in FIG. 8 and provides another view of the high temperature conductor 80 extending from the power supply comprising the current transformer 330 toward electronics housing 50. The power supply comprises an electronics circuit board (not shown) configured to condition AC voltage from the current transformer 330 and convert it to DC voltage to be supplied to the main electronics board 500 via the cable 80.

Power for the Data Acquisition Device and Resolution of Thermal Issues

While it does not seem reasonable, conventional systems have difficulty getting a few watts of power (e.g., for powering a processor or sensors) from a power line carrying a million watts of power. The present invention overcomes these difficulties, that is, the smart clamp 1 is able to extract a small amount of power from a power line or wire 30 to which it is secured in accordance with an illustrative embodiment of the present invention.

A practical means to extract power from the power line is a current transformer; however, to accommodate a 3 amps (A) to 3000 A conductor 30 current range, this transformer becomes a substantial piece of iron (e.g., about 4 pounds) with copper windings (e.g., about 9000 turns) which extracts power from the magnetic fields surrounding the main conductor 30 created by the electron flow therein. For example, a conventional split, square current transformer can be used (e.g., a model CTS-1250-300A current transformer available from Continental Control Systems LLC, Boulder, Colo.). One side can be removed to permit clamping the transformer 330 over the conductor 30. The extracted power is utilized to power the smart clamp 1 and its various sensors, data analysis components and communication equipment, which can consume as many as 10 watts. Alternatively to extracted power (e.g., via a power supply assembly with current transformer 330), batteries and solar cells can also be used to power the clamp 1 electronics, among other power sources for electronics.

Figure 9:
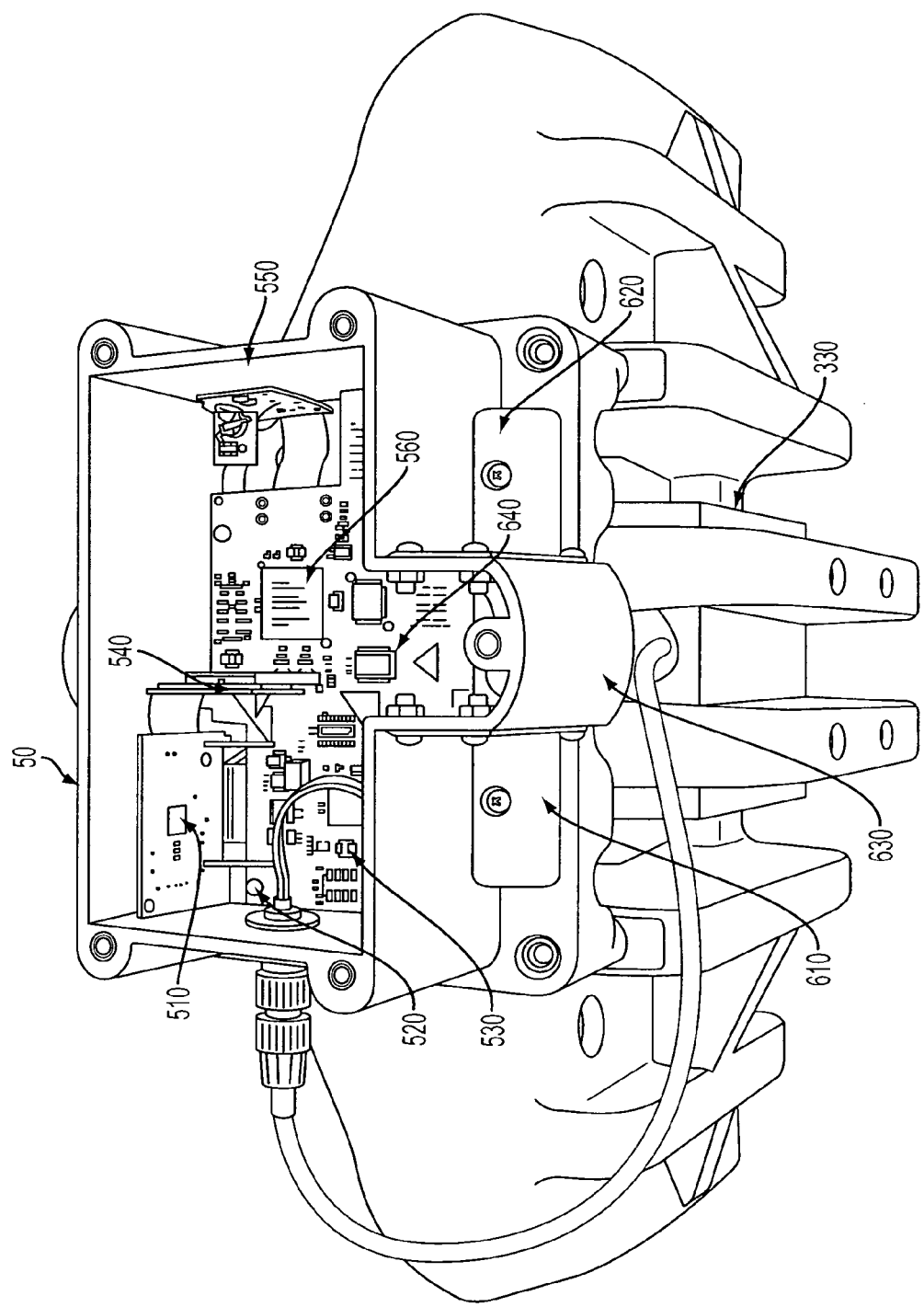
FIG. 9 is a perspective view of the smart clamp of FIG. 5 showing contents of the electronics housing and various sensors in accordance with an illustrative embodiment of the present invention.
Figure 12:
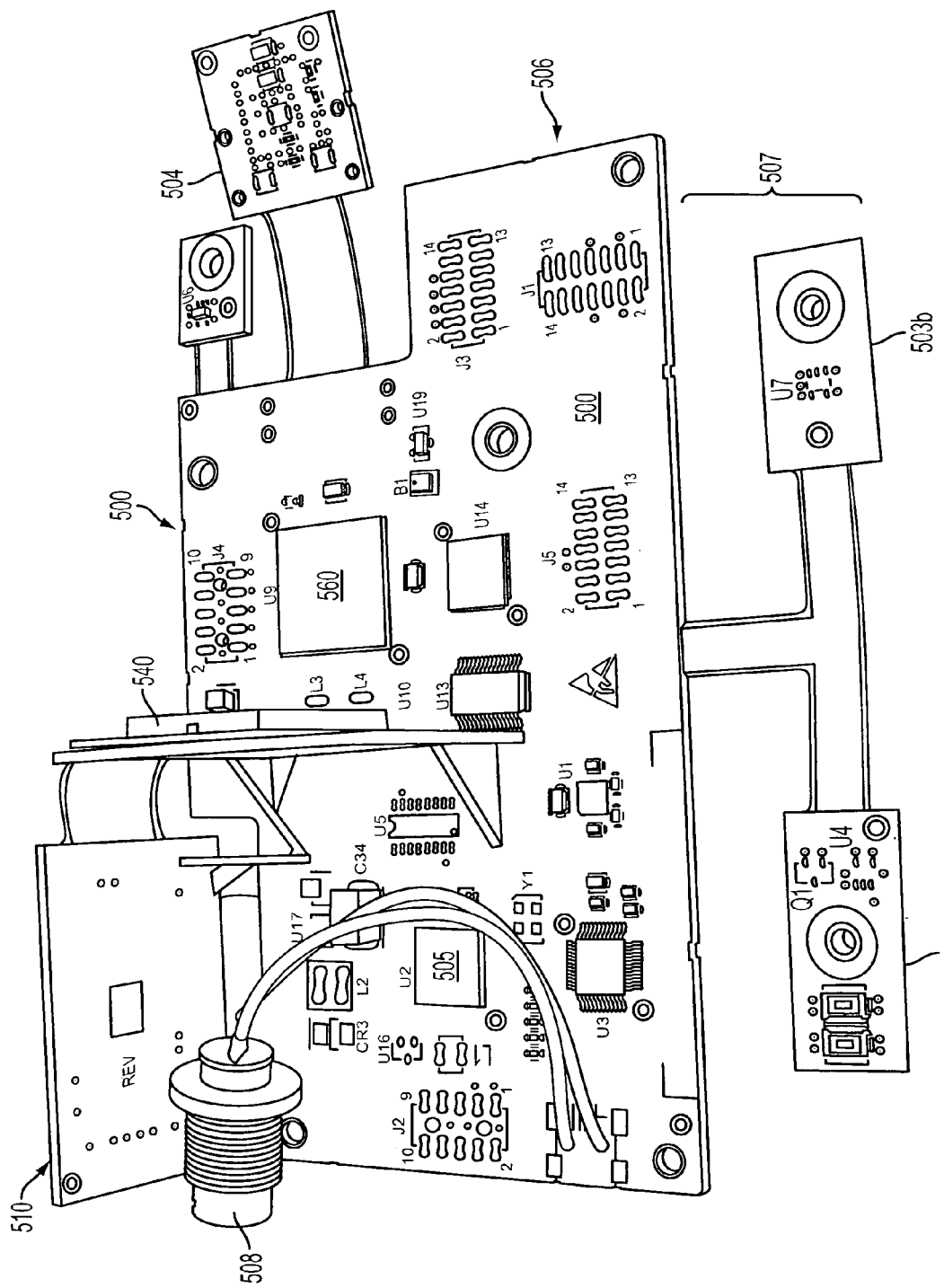
FIG. 12 is a perspective view of a main board of a smart clamp in accordance with an illustrative embodiment of the present invention.

As stated above, the smart clamp 1 uses the power supply assembly with current transformer 330 to extract power from the magnetic field generated by the current passing through the main conductor 30 to which the current transformer 330 surrounds. The transformer 330 can be a split transformer having an upper portion 331 and a lower portion 332 so that can be clamped around the power line or wire 30 as described below in connection with FIGS. 6, 7 and 8. As stated above, a high temperature wire 80 extends from an output of the power supply assembly to an input of the electronics housing 50 to provide power to the electronic circuits therein. An energy storage device can optionally be provided in the smart clamp 1 (e.g., a capacitor on the main board 500 as shown in FIGS. 9 and 12) to allow the smart clamp 1 to operate long enough to send a last message (e.g., to a base station or other network monitoring device) before power is lost.

The conductor 30 enclosed by the clamp body 110 and keeper body 310 can get quite warm due to the very large current carried by the conductor. Typically, older style wire is allowed to get to about 75° C. before it gets soft and starts to sag. Newer style wire is starting to be deployed which can reach 250° C. before it gets soft and starts to sag. Electronics generally will not tolerate this temperature, and therefore the electronics housing 50 is positioned to the side and separated from the main body of the smart clamp by a heat shield 70. The heat shield 70 can be connected to the side of the clamp 1 (e.g., with separators 72 for thermal insulation) and the electronics housing 50 can be connected to the heat shield 70, for example. The heat shield is constructed of aluminum. The electronics housing 50 can be made of non-metallic material to facilitate operation of the radio 540 and GPS unit 510.

The current transformer 330 surrounds the main conductor in order to harvest the energy, and, in some implementations, the current transformer 330 will not tolerate temperatures above 85° C. The holes or cooling chimneys 111 in the keeper body 310 and the clamp body 110 of the smart clamp 1 allow air flow to cool the transformer 330. Alternatively, as stated above, the power supply assembly with portions 331 and 332 of the transformer 330 can be attached to the conductor 30 via a clamp at a location adjacent to the clamp 1. Further, the smart clamp 1 itself acts as a heat sink to reduce the temperature. The transformer 330 can be encased in thermal insulation material to provide additional protection.

Data Acquisition Device Sensors and Electronic Components

The smart clamp 1 includes various sensors in or near the electronics housing 50, which is insulated from heat by the heat shield 70 as described above.

With reference to FIG. 9, the electronics housing 50 is shown with a cover removed to expose a main board 500 mounted inside in accordance with an illustrative embodiment of the present invention. As shown in FIG. 5, the electronics housing 50 has a section 52 extending from a main section 51. Parallel housing sections 54 are connected to opposite sides of the section 52 and extend oppositely to each other and parallel to the longitudinal axis of the conductor 30 and clamp 1. The main board 500 is secured in the section 51. Additional sensor circuits for measuring wind speed and ambient temperature (e.g., indicated generally at 610 and 620 in FIG. 9 and shown in FIGS. 11a and 12) are electrically connected to the main board 500 (e.g., via ribbon cable) and extend therefrom for deployment in the parallel sections 54 as described in further detail below.

With continued reference to FIG. 9, the main board 500 supports and processes inputs from a number of sensors and measurement devices including, but not limited to, a Global Positioning Device (GPS) 510, a sensor 520 for measuring conductor 30 temperature, a conductor 30 current sensor 530, the wind speed detector 610, a vibration detector 630, an audio corona detector 640, the ambient temperature sensor 620, and at least one camera 550 and its interface 504. Additional sensors, such as additional cameras can be included. The sensors are described in more detail below. In addition, the main board 500 supports an encrypted radio 540 and encrypted web access 560. These communications devices are described in more detail below. The main board 500 comprises a central processing unit (CPU) 505 and associated memory device 502 (e.g., a non-volatile memory such as a flash disk) and program code for processing data from the sensors and communications. In another implementation, the electronic circuitry may be located outside of the clamp or transmission line in an external box which may or may not have a faraday cage. This arrangement would be suitable, for example, for a gas pipeline as well as for certain electrical transmission lines.

Figure 11B:
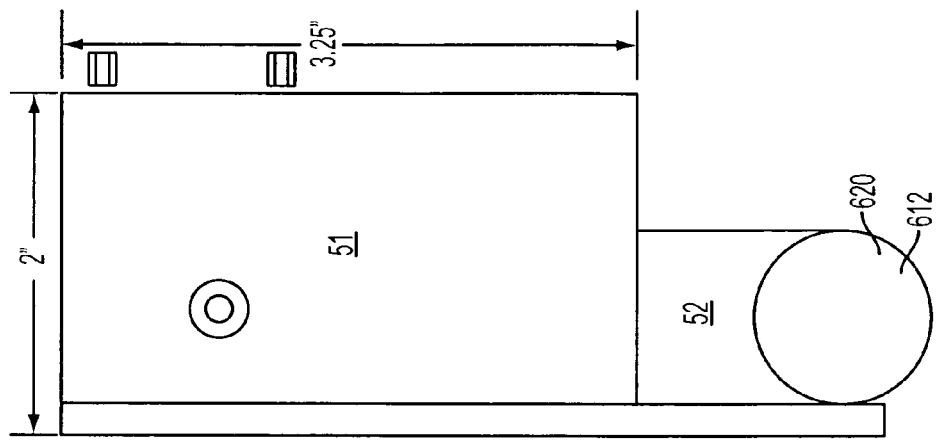
FIGS. 11a and 11b are, respectively, a top view and a side view of an electronics housing for a smart clamp in accordance with an illustrative embodiment of the present invention.
Figure 11A:
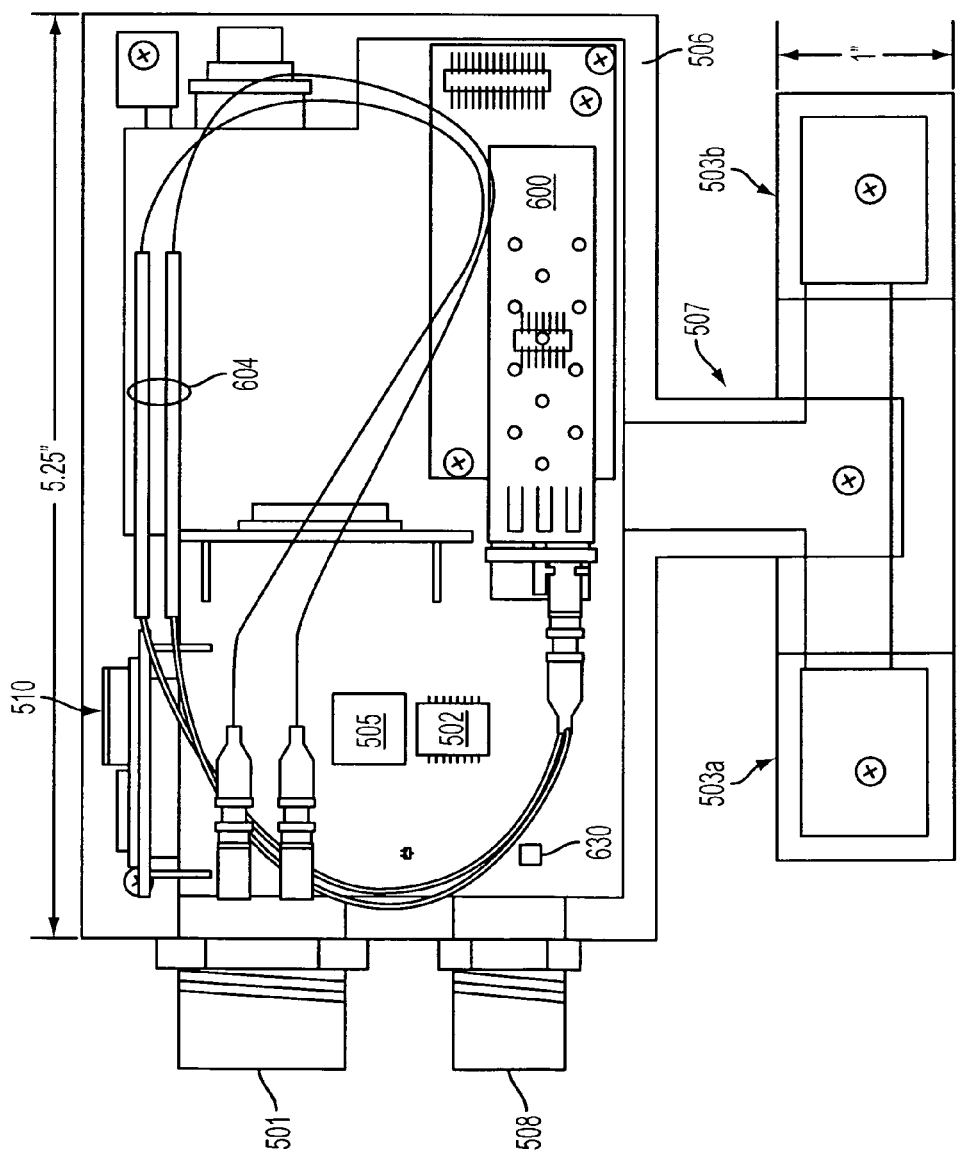

As shown in FIG. 11a, the electronics housing 50 can also be provided with connectors 501 and 508 for power and fiber optics, respectively. As shown in FIG. 12, a connector 501 is electronically connected to a power subsystem on the main board 500 such that, when the high temperature cable 80 carrying DC power is connected to the connector 508, the main board 500 can provide power to the sensors and other electronic devices that it supports.

FIGS. 11a and 12 illustrate a main board 500 and other components in accordance with illustrative embodiments of the present invention. FIG. 11a is a front view of a main board 500 in an electronics housing 50. The main board can be connected to a camera 550 having a lens installed in an aperture provided in the electronics housing 50 as shown on one side of the housing 50 depicted in FIG. 11b. The other side (not shown) of the housing 50 and main board 500 can also be installed with another camera (i.e., with lens mounted in an aperture of the housing 50) to enable images to be taken along the sections of the conductor 30 extending from both sides of the clamp 1.

An illustrative small camera 550 operates in the −40° C. to +85° C. range, and with fixed focus down to two feet, for example. The head is 8 mm×5.6 mm. The camera(s) 550 can capture still images of line 30 conditions such as ice, sagging, carbonized debris and so on. Video images can also be provided as communication bandwidth permits. As described below, by representing each smart clamp 1 with its own web page, the respective web pages for smart clamps can present users with convenient information regarding various line conditions such as images of ice and the like, and listings of measured parameters such as temperature, wind, among others and whether they are in selected ranges or not or meet selected thresholds.

There is no practical means that is cost-effective to sense voltage directly from the power line 30, at the present time, without reliance upon a ground-based system. While current can be sensed by a second current transformer, a Hall Effect sensor integrated circuit (IC) 530, which is smaller and less expensive, can be utilized in the smart clamp 1 (e.g., on the main board 500). The current sensor 530 can be based on the Hall Effect rather than the more traditional Rogowski coil, wherein harmonic distortion of the current sine wave is measured by a distortion that can be caused by unusual loads, a saturated transformer, or a malfunctioning generator.

Conductor temperature can also be measured with an IC. For example, the smart clamp 1 can be provided with a thermal jumper 520 between the conductor or transmission line to an electronic component on the main board 500 that can empirically determine the temperature of the transmission line.

The smart clamp 1 can include detectors 610, 620 and 630 for measuring wind speed sensor, ambient temperature and conductor vibration, respectively, as illustrated in FIG. 9. The wind speed detector 610 is advantageous because it is implemented with no moving parts. In accordance with an embodiment of the present invention, wind speed is sensed by a heated element extended from the body of the clamp 1. For example, two wind detection devices are disposed proximally to the electronics housing 50 and on the same axis as the conductor or transmission line 30 coupled to the smart clamp 1. The difference between the temperature of the element predicted in still air and the temperature drop in the other element caused by wind can be used to calculate wind speed.

More specifically, as stated above, the electronics housing 50 has parallel housing sections 54 which extend parallel to the longitudinal axis of the conductor 30 and clamp 1 and in which the detectors 610 and 620 for measuring wind speed and ambient temperature are deployed. As shown in FIGS. 11a and 12, a main board 500 can have a main section 506 and at least one section 507 extending therefrom (e.g., via ribbon cable or other conductor). The section 507 supports at least the wind sensor 610 and the ambient temperature sensor. The wind speed detector 610 operates generally using the same principle as a hot wire anemometer in that it comprises one of the parallel sections 54 (e.g., see "503a" in FIGS. 11a and 12), which is heated by an element (not shown). As wind blows over the clamp 1 including the parallel sections 54, the heated section 503a cools. The other section 54 (e.g., see "503b" in FIGS. 11a and 12) is provided with the ambient temperature sensor 620. The CPU 505 is programmed to determine wind speed based on the difference between the measured ambient temperature and the measured temperature of the heated section 503a. The ambient temperature sensor 620 is placed in the section 503b opposite from the heated section 503a so that its measurement of ambient temperature is not skewed by the heating element for the heated section 503a. The CPU 505 can be programmed to determine wind speed in the direction perpendicular to the longitudinal axis of the conductor 30 (i.e., a parameter often sought by utility companies) using various geometrically-based calculations.

It is to be understood that the wind speed detector 610 can be implemented using other configurations in accordance with other illustrative embodiments of the present invention than that shown in FIGS. 9, 11 and 12. For example, as shown in FIG. 10, a clamp 1 can be provided with a protrusion from its housing 50 to accommodate a hot wire anemometer 612, and optionally a radio antenna 542 for a radio interface 540 described below.

The vibration sensor 630 can be implemented a number of different ways. For example, a tension meter with adequate bandwidth (128 Hz) can be used to measure vibration. If a relatively large tension meter is not present, then a smaller, 3-axis accelerometer can be installed 1 or 2 feet away from the clamp 1, or a similar device can be integrated into the smart clamp 1 itself. If an external sensor is used, movement can be measured and provided to the main clamp 1 via four wires (i.e., two for power and two for communication), for example, for interfacing to the board 500 and its CPU 505.

More specifically, measuring tension in a wire conductor 30 can generally be performed using a device (e.g., a Quick Balance tension meter available from Dillon, an Avery Weigh-Tronix company in Fairmont, Minn., that is installed in or near the clamp 1 and clamped onto the conductor 30) which deflects the wire 30 a little and measures the force the wire exerts in an attempt to be straight. The CPU 505 can use geometric-based calculations to provide a scaling factor between the force on the device and the tension in the wire 30. Measuring tension can also be performed using an external sensor such as a load cell with a mechanical disadvantage to bring the 10,000 lb. max tension to 100-200 lbs., as shown in FIG. 10, which can be sensed. Vibration can also be sensed by sensing variation in tension or measured with an accelerometer IC attached to the line a short distance from the clamp 1.

As stated above, the clamp 1 also has a corona detector 640. Corona on insulators is not in the visible spectrum. It is in deep ultra violet spectrum (e.g., about 280 nm). Cameras that can take images of ultra violet flashes are prohibitively expensive, particularly when it is taken into account that corona is sporadic, intermittent and significantly affected by air pressure, moisture and other dynamic conditions. Silicon sensors are not very sensitive to this range, that is, they are about 10% efficient as compared to sensitivity to visible light. A very good filter is required to remove visible light, even at night. During the day, the sensor would be swamped with visible light even with the filter. Visible light cameras in general do not survive the temperature extremes of the environment of the monitored line 30, even if the cameras are turned off. In accordance with an illustrative embodiment of the present invention, a method of corona detection is provided that employs audio corona detection (e.g., storing an audio signature(s) of corona and employing sensors for detecting audio noise and performing comparisons with signature(s) to detect corona). The audio-detected corona can be time tagged and its duration recorded, among other parameters.

With continued reference to FIG. 9, the audio corona detector 640 can comprise a microphone and digital signal processor (DSP) (not shown) to obtain and process an audio signature ("sizzling sound") of corona. Samples of frequency sampled corona sounds can be stored as signatures. The output of the microphone can be continually or periodically sampled by the DSP. The DSP then compares the samples to signatures or otherwise processes samples with respect to selected threshold characteristics to determine if an alert should be generated that a corona event has occurred. An alert can be sent, for example, each time a corona event is detected, or after a selected number of detected corona events has occurred to assist with calibrating the DSP to more accurately characterize sounds as corona events.

One or more smart clamps 1 may detect a lightning event. The smart clamp system utilizes a GPS unit 510 to precisely locate the positions of the smart clamps 1. Using GPS also allows for the measurement of the precise time information for measuring one or more events sensed or detected by the smart clamps 1 (e.g., phase angle). An antenna is provided on the main board 500. A 300 kHz bandwidth filter is also provided to detect surges from a lightning strike. It is not necessary for lightning to strike the line to detect the lightning. For instance, lightning strikes within a few miles from a smart clamp can be detected and time stamped. Geometry shared among three collocated smart clamps 1 allows for triangulation of the strike location.

In addition, the smart clamp 1 can be configured to take voltage measurement of the power line. At present, it is very expensive to measure 110 kv to 765 kv, which is typical for a power transmission line. Regardless, voltage with respect to the ground could be measured using an external voltage detector which communicates over the same radio links (not shown).

In accordance with an illustrative embodiment of the present invention, a short range (e.g., 2 km) radio network can be used in the smart grid system whereby the smart clamps 1 or other data acquisition devices can "hop" data along the transmission line 30 until aggregated data can be brought to a remote terminal, which could interface to public or private land based transmission as described in connection with FIGS. 13-15.

With reference to FIG. 9, a clamp 1 is provided with a radio (e.g., an encrypted radio) 540. For example, the radio 540 can be a standard, FCC approved, digital radio with a data rate of 250 kbps, and AES128 encryption, which is low cost, environmentally robust and also saves development cost and minimizes deployment cost. One such radio is a Synapse RF Engine ZigBee Radio Board (RFET) available from Synapse Wireless Inc., Huntsville, Ala. Having dimensions of approximately 1.33" per side, it can be provided on the main board 500 in the electronics housing 50, as shown in FIGS. 9 and 12. With a 5" antenna, as shown in FIG. 11a, the radio 540 has a range of approximately 2-3 km.

To interface to public or private land based transmission, an optional illustrative optical interface 600 can be provided to a data acquisition device main board 500 that operates as standard 100BaseFX Ethernet 100 Mbps Media Independent Interface (MII) to the main processor on the board 500 in accordance with an illustrative embodiment of the present invention.

FIGS. 10 and 11a depict an optional optical interface 600 installed on the main board 500 in accordance with another illustrative embodiment of the present invention. The optical cables 602 can be provided with strain relief. Optical splitter/combiners are indicated generally at 604. The optical interface 600 can comprise a dual small-form factor pluggable (SFP) to support linear fiber drop and continue topology.

An optical connector 606 (e.g., a weather tight fiber optic connector) can be provided in the electronics housing 50, in addition to a connector 508 for the power cable 80. The optical interface 600 is useful at ground level or in applications or in lower voltage applications when the optical cable will not shunt the effect of high voltage insulators. Alternately, the main board 500 can be reused as a radio-to-Ethernet adaptor 710 at certain sites and include, for convenience, a standard RJ45 electrical 10/100BaseT interface as well as or in lieu of the 100BaseFX optical interface.

The low power radio 540 in each of the smart clamps 1 in the smart clamp system includes powerful encryption and is used to communicate back to a central location 700, as will be described in connection with FIGS. 13-15. For a long power transmission line 30, there could be hundreds of smart clamps 1 and, therefore, hundreds of radio hops that would be required to reach a switching node 700. Illustrative embodiments of the present invention implement encryption and large numbers of hops between data acquisition devices over long distances and therefore accommodate the transmission delays that remain a problem for existing radio technology.

For ease of use and in accordance with an advantageous, illustrative embodiment of the present invention, the smart clamp system can require little or no knowledge of communication protocols, radio technology, or other technologies that are not presently familiar to power companies that would use the smart clamp system. As long as clamps 1 are installed within their radio range, they will communicate with the main computer system (e.g., a central monitoring location 700) upon installation. Once installed, the clamp 1 begins to operate automatically. Power is automatically provided to the electronics 500, sensors automatically begin to detect real-time conditions, the GPS 510 determines the clamp location, the radio 540 detects neighboring clamps and substation adaptors 710, and communications begin. This embodiment is therefore superior to existing technology that requires programming a central database to organize remote sensing devices or the need to program in individual nodes with cell phone numbers or IP addresses to administer a sensor network.

In accordance with an illustrative embodiment of the present invention, each smart clamp 1 is configured to operate as an internet web server. The communication can be set up over a private network, so there is no connection to the public Internet, to improve security. The smart clamp 1 can include an encrypted web access unit 560 to enable secure access to the Internet, as shown in FIG. 9, for e-mail alerts and to surf-the-grid (i.e., browse web pages created for each clamp 1 to obtain measured parameters and other information).

When a fault is detected, the smart clamp 1 is configured (e.g., via firmware provided to the CPU 505) to send a message (e.g., in the form of an e-mail) to a programmable address with a short message to indicate the problem and the location. One arrangement can include measures to limit or coordinate the number of such messages to minimize "overloading" a central monitoring point 700. The messages are then communicated via a radio communication link to an adaptor 710, for example, for aggregation and optionally to other ground based monitoring stations 700 (e.g., via ground based communications) if not co-located with the adaptor 710.

The radios 540 used by the smart clamps 1 can be adapted to standard Ethernet quite easily and tied to an ordinary local area network. A user is able to access the smart clamp devices 1 by entering respective web page addresses and thereby searching or querying the grid. It is noted that conventional monitoring systems require a highly specialized and very expensive central computer system and software to gather the measurements. The simplicity of expanding the system and ability to be accessed from many sites can be well established, and the system can be easily implemented by using inexpensive Ethernet equipment that is readily available.

Radio Issues

At present, the Zigbee radio is a standard, packet-based, low power radio intended for providing communication within a building or over only a few acres. However, it does include AES128 encryption which is currently considered effective. However, in 5 years, such encryption may be considered to be inadequate. It is noted that all Zigbee radios in a network must use the same encryption key. If the key changes, all radios must be updated at the same time. For about 20 radios on one property, that may be considered to be acceptable; however, for tens of thousands of radios spread across an electric grid or other network of data acquisition devices as proposed in accordance with embodiments of the present invention, using conventional Zigbee radios in a network would not be a good system. For example, breaking only one encryption key would make the entire system vulnerable. In addition, the Zigbee standard sets a limit on the response delay that is reasonable for 10 or 20 radio hops, but it cannot accommodate, for example, 500 hops, as needed for a power transmission line application or other geographically expansive application contemplated by illustrative embodiments of the present invention.

The Zigbee standard describes two kinds of radios: a coordinator and a peripheral. Coordinators are responsible for repeating messages to get them to the desired destination if a repeat is needed. The provision of a radio as either coordinator or peripheral is a manual setup operation that needs to be avoided based upon the potential deployment of tens of thousands of smart clamps 1. In accordance with the illustrative embodiments of the present invention, for simplicity and ease of use, a technician can install the clamp 1 with a ratchet wrench and complete the installation without knowing anything about communication protocols or network architecture.

Radio Protocol for Very Large Networks

While conventional Zigbee radio may be an adequate starting point for a simple radio design, it is inadequate for geographically expansive applications such as those accommodated by illustrative embodiments of the present invention. An illustrative embodiment of the present invention provides a customized Zigbee radio design that institutes advantageous changes for use with the smart clamp 1 in a smart clamp system. Instead of having one encryption key for all radios 540 in the system, for improved security, the keys are dynamically provided (e.g., negotiated at each transaction in a manner similar to how internet bank transactions are handled). For example, it can be implemented in the Secure Socket Layer (SSL) which is part of all web browsers. In addition, the tolerance for delay is extended substantially. Instead of a few milliseconds, replies on very long lines could take a minute. If an Ethernet port that consists of smart clamp electronics 500 with both a radio 540 and optical or electrical Ethernet interface 600 can be installed at the base of a tower in the middle of long line, the data can be backhauled over leased telecom lines or private lines owned by the power company. This reduces the maximum number of hops and reduces the response delay. However, smart clamp communications message routing is uniquely designed to be tolerant of the described very long delays to support large networks even if leased telecom lines or private lines are not available.

Each smart clamp 1 is configured (e.g., via the programmed CPU 505, the radio 540 and other devices on the main board 500) to implement message routing similar to a common Ethernet switch. Some of the same concepts are used, but substantial modification is provided in accordance with illustrative embodiments of the present invention to accommodate the radio environment as described below.

The smart clamps 1 in accordance with illustrative embodiments of the present invention are intended to be installed, with a life expectancy of approximately 20 years or longer. It is noted that telecom equipment that lasts a similar period, in an outside environment, is currently available. As an alternative to using radios 540, smart clamps 1 can be provided with lasers for optical communication, but their life expectancy may be limited to 5 to 7 years, which is far shorter than the radio equipment 540. At ground level, where smart clamps 1 having both a radio 540 and optical or electrical Ethernet interface 600 can be used to communicate over a conventional utility or telephone company circuit, an optical interface 600 is easily serviced if it becomes necessary.

While the smart clamp 1 hardware can last as long as 20 years, the software, encryption, communication protocol, and other features of a smart clamp 1 are likely to become obsolete over that time period. The smart clamp 1, however, includes data storage that operates like a disk drive (e.g., flash drive 502). Software can therefore be updated remotely to accommodate most of these changes or updates.

When future requirements simply outstrip the capability of the existing hardware, new electronics can be installed without removing the entire clamp. The side box or electronics housing 50 containing the electronics can be replaced separately. This is also an important factor for replacing failed or malfunctioning smart clamps 1.

As stated above, implementing a radio network for a geographically expansive transmission line grid (e.g., a power transmission grid) presents challenges that are not present in a smaller geographic area. Transmission lines 30 are inherently linear covering extremely long distances—up to 500 miles or longer. In as much as highways are often monitored mile by mile, it is desirable to monitor transmission lines at least every mile to help pinpoint issues and characterize performance. While there are cost-effective unlicensed radios with a nominal 1 mile range, sending a message via such radios from one end of a 500 mile transmission line to the other could require 500 radio repeats in each direction which requires a communication protocol that can accommodate very long delays. That is, the maximum response time (before the message is deemed lost) would necessarily be minutes instead of milliseconds.

The long transmission line 30 is not the only issue. The network for monitoring smart clamps 1 also branches when several radios 540 are in close proximity (e.g., when smart clamps 1 are installed to monitor all 3 phases on one tower or when several transmission lines 30 converge at a substation). All of the smart clamps 1 need to be able to assemble into a coherent communication network without manual intervention in accordance with an advantage of an illustrative embodiment of the present invention.

In accordance with an illustrative embodiment of the present invention, a more practical network is achieved by adapting the smart grid to a more common media and protocol stack such as Ethernet and TCP/IP. Thus, a radio-to-copper or optical Ethernet adaptor 710 is placed strategically around the power grid, for example. Certainly, substations are a likely place for such an adaptor, but there could be convenient points along a transmission line 30 for an adaptor as well. The adaptor 710 comprises a radio 540, a standard Ethernet port 712, and suitable protocol conversion. The resulting Ethernet interface is therefore suitable to interface with public communication lines (telcos), private networks, cable TV modems, DSL, and/or other internet type access technologies.

As stated above, a main board 500 can be used as a radio-to-Ethernet adaptor 710 at certain sites. An example of a data acquisition device main board that can be configured as an adaptor 710 is provided in FIGS. 10 and 11a. The adaptor 710 can be physically different from the line data acquisition device (e.g., a smart clamp 1) and has a different function. The adaptor 710 can identify itself as a port where messages originate and are terminated. It is a homing location. An illustrative operation of the data acquisition devices (e.g., smart clamps 1) and the network organization is to reach one of these adaptors 710 with minimal delay which is defined as the minimum number of repeats or hops required.

When a packet is received by a data acquisition device (e.g., a smart clamp 1), there are three options for disposition of the message, by way of an example. If the message is intended for the same data acquisition device, the CPU 505 of the data acquisition device processes the message. If the message is not intended for this local data acquisition device, either the message is repeated, or it is not repeated because it will be routed by another device. Messages can be images (e.g., still or video images capture by the camera(s) 550), measured or sensed parameters from the data acquisition device that can be reported in various formats, standardized messages or alerts (e.g., text, audio, or graphics), e-mails, HTML files, among others. The messages are packetized by the CPU 505, for example. As explained below, the messages are aggregated (e.g., via an adaptor 710) for access by a user (e.g., using a web browser and web address assigned to each adaptor 710).

Each message can include an 8 byte long source address and 8 byte destination address. These addresses are the Media Access Control (MAC) address which is programmed in during manufacturing and unique to every radio. The MAC address is used to route the packets. While a layer 3 protocol, such as Internet Protocol (IP), might seem more appropriate, some manual setup (which could be time consuming, require accurate records and be unfamiliar to utility technicians who are bolting the smart clamp or similar accessories in place) could be required to set the IP address. In addition, each of the data acquisition devices 1 is being used as a web server in accordance with illustrative embodiments of the present invention. This requires a fixed IP address rather than an IP address that is assigned automatically as would be the case if Dynamic Host Control Protocol (DHCP) is used. To avoid the issue, the routing by data acquisition devices such as a smart clamp 1 is performed at layer 2, the media layer.

With each smart clamp 1 operating as a layer 2 router, each data acquisition device or smart clamp 1 will need to track thousands of MAC addresses to know whether to repeat or not repeat a message. This is not practical for a moderately sized CPU 505. Instead, each data acquisition device can be provided with a high speed memory 502 attached to custom hardware (not shown) in the main board 500 that compares a list of known MAC addresses to that of the destination address in the packet. Upon finding a match, the data acquisition device will know whether the packet needs to be repeated or simply ignored.

In an illustrative implementation, the number of MAC addresses is limited to a selected number (e.g., on the order of 26,400) that is a compromise of processing speed, packet duration time, and power consumption while still maintaining the requirement of thousands of devices in a single subnetwork. If required, larger numbers of MAC addresses can be supported.

To create the table of MAC addresses in the high speed memory 502, each data acquisition device needs to announce it is present. In the simplest case, this is begun with a broadcast message from an adaptor 710. Each data acquisition device (e.g., smart clamp 1) forwards the message but increments the hop count within the message. Each device also replies to the message with the minimum hop count received. Naturally, each device 1 will see many copies of the message. In most cases, the earliest message will have the smallest hop count, and the device will reply with that hop count. However, there are some less likely situations where a smaller hop count can be received later in the process. The device will reply to this smaller hop count which appears later. However, it will not reply to the adaptor 710 with a larger hop count.

During this process, each data acquisition device (e.g., smart clamp 1) will become familiar with devices in the immediate vicinity. Each device will know the hop count to the adaptor 710 for its neighbors. In general, the devices with the lowest hop count will be responsible for performing repeat operations for devices with higher hop counts. However, each device is configured to perform a repeat or hop even when it appears there is a lower count path available.

Figure 13A:
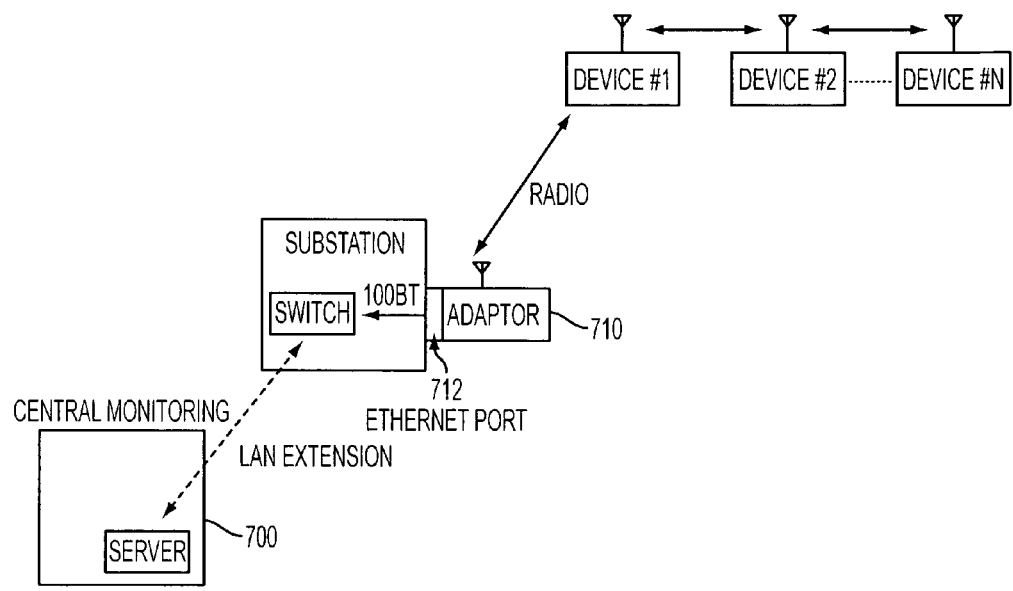
FIGS. 13a and 13b illustrate a communication network comprising data acquisition devices (e.g., several of the smart clamp in FIG. 5) in radio communication in accordance with an illustrative embodiment of the present invention.
Figure 13B:
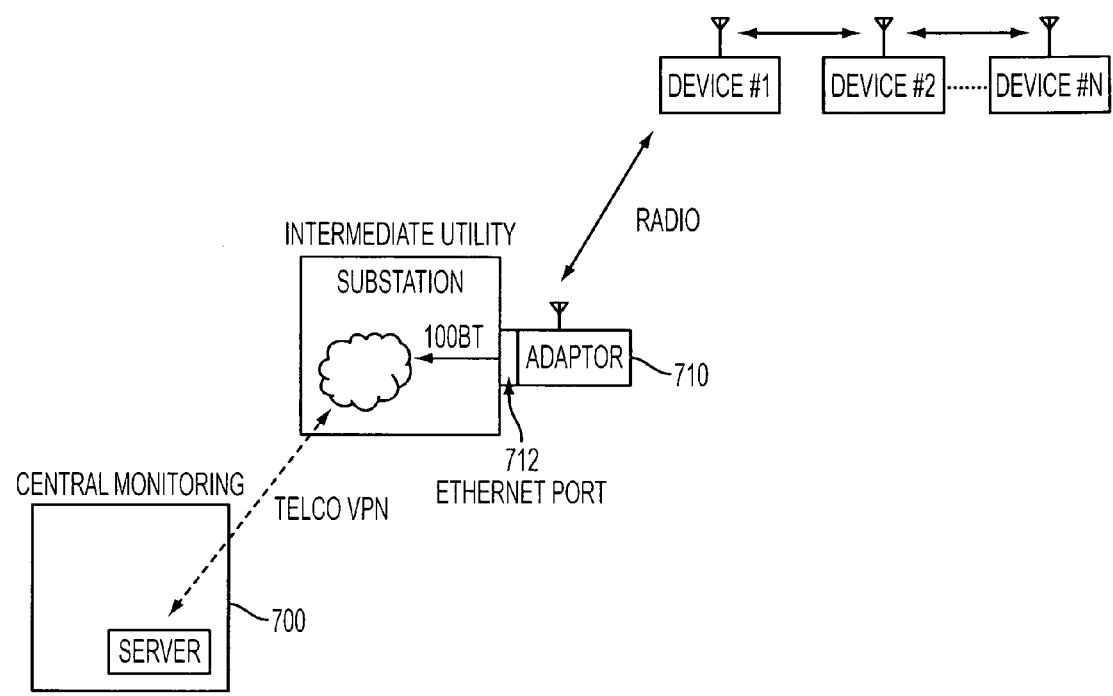

Consider a simple linear case, as shown in FIGS. 13*a* and 13*b*. Data acquisition device #1 will be 1 hop count from the adaptor 710. Data acquisition device #2 will be 2 hop counts since device #2 is not in range of direct connection to the adaptor 710. Device #3 is 3 hop counts from the adaptor.

The adaptor 710 issues the configuration broadcast. Device #1 repeats it with a hop count of one. It also replies to the adaptor 710 with a hop count of 1. Device #2 will receive the repeated configuration message with a hop count of 1 and the reply from Device #1 with a hop count of 1. Device #1 will take the reply from Device #2 and repeat it to the adaptor 710 with an incremented hop count. Device #2 repeats the configuration message with a hop count of 2 and also replies toward the adaptor 710 with a hop count of 2. Device #3 receives the repeated broadcast from the adaptor 710 and replies to it with an incremented hop count. Device #2 repeats the reply from Device #3 toward the adaptor 710 with an incremented hop count.

Device #1 determines that it can communicate directly to the adaptor 710. It also determines that the Device #2 reply did not have a hop count of zero, and so Device #2 must be relying on Device #1 to communicate to the adaptor 1. Device #1 also determines from the messages that another device is in the network (i.e., Device #3) and has an even larger hop count. Accordingly, Device #1 repeats messages to the adaptor 710 from that device as well.

Figure 14:
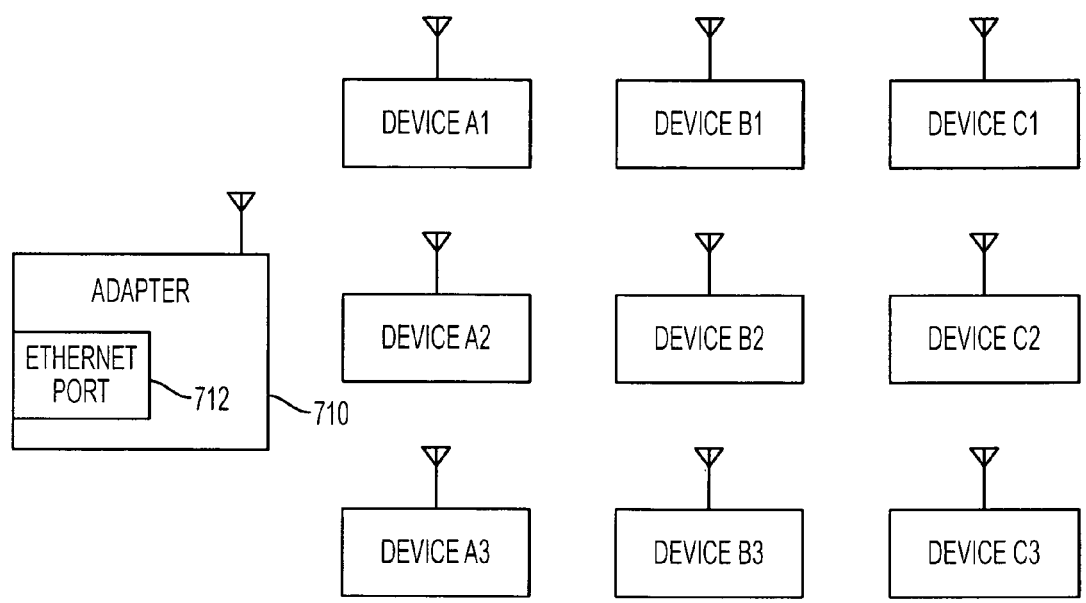
FIG. 14 illustrates a more complex example of a communication network than that shown in FIG. 13a or 13b.

In a more complex situation, there are multiple valid paths back to the adaptor as shown in FIG. 14. This example assumes all 3 phases of a power transmission line 30 are being measured at the same points.

In this case, all A devices (e.g., Devices A1, A2, A3) can receive messages from each other and all B devices (e.g., Devices B1, B2, B3) and the adaptor 710. All B devices can hear all A, B, and C devices (e.g., Devices A1, A2, B1, B2, B3, C1, C2 and C3), but not the adaptor. All C devices (Devices C1, C2 and C3) can hear B devices and C devices. The decision on the path is not longer but rather just a matter of the only path available. A decision factor in this case will be the MAC address. For example, the device with the lowest MAC address will be the repeater. While the MAC address is 8 bytes long, manageably short numbers are used in this example. Device B1 will have address 10, B2 is 11, and B3 is 12. Devices B2 and B3 will be able to receive the response of Device B1 and realize the number of hops provided back to the adaptor 510 is the same as the number of hops they are providing. The MAC address of Device B1 is the lowest so Device B2 and Device B3 will automatically defer to allow Device B1 to perform repeats for Devices C1, C2, and C3. The use of the lowest MAC address is arbitrary. The decision can be made by using some other fixed relationship between the MAC address such as choosing the highest address or other factor.

In the above example, any one of the devices could fail and there would still be a path back to the adaptor 710 at the left side. Some reconfiguration could be required. For that reason, the reconfiguration message is periodically broadcast from the adaptor 710 (e.g., every 15 minutes). If a device realizes it can no longer communicate with the adaptor 710, it can issue a request to reconfigure which all devices will repeat toward the adaptor 710.

Figure 15:
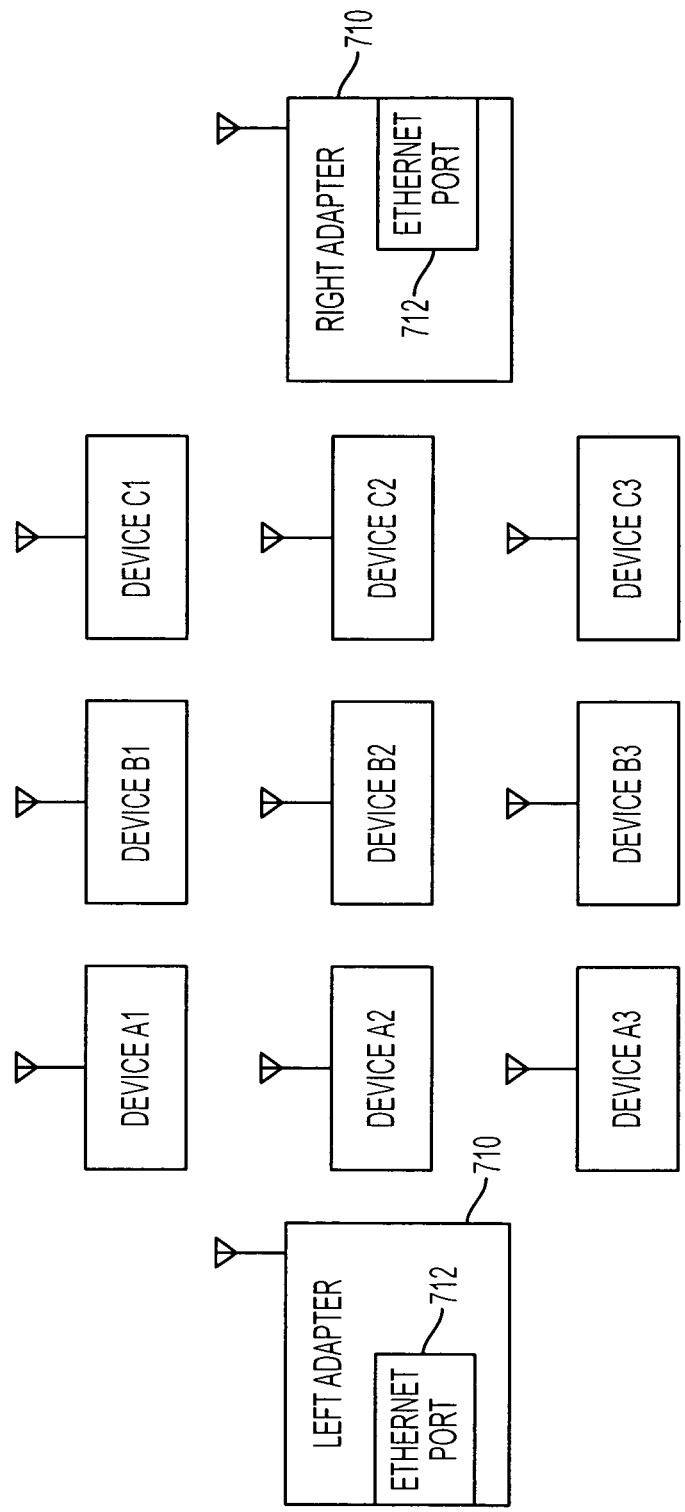
FIG. 15 illustrates a communication network with more than one adaptor in accordance with an illustrative embodiment of the present invention.

A network, as shown in FIG. 15, can have more than one adaptor 710. For example, another adaptor can be representative of a transmission line 30 between two substations where there is an adaptor at each substation.

Assume Device A1 has the lowest MAC address among Devices A1, A2, and A3. Device B1 has the lowest MAC address among Devices B1, B2, and B3. Device C1 has the lowest MAC addresses among Devices C1, C2, and C3. The shortest number of hops to an adaptor for the A devices is to the left. The shortest path to an adaptor for the C devices is to the right adaptor. The B devices could reach either adaptor with 2 hops. The tie breaker will be the MAC address of Device A1 and Device C1. The B devices will use the path with the lowest MAC address of either Device A1 or Device C1.

A system with three or more adaptors can be accommodated with the same algorithm. First, find the closest adaptor in terms of the number of hops. Where there is a tie, use the MAC address of the nearest repeaters to break the tie.

Figure 1:
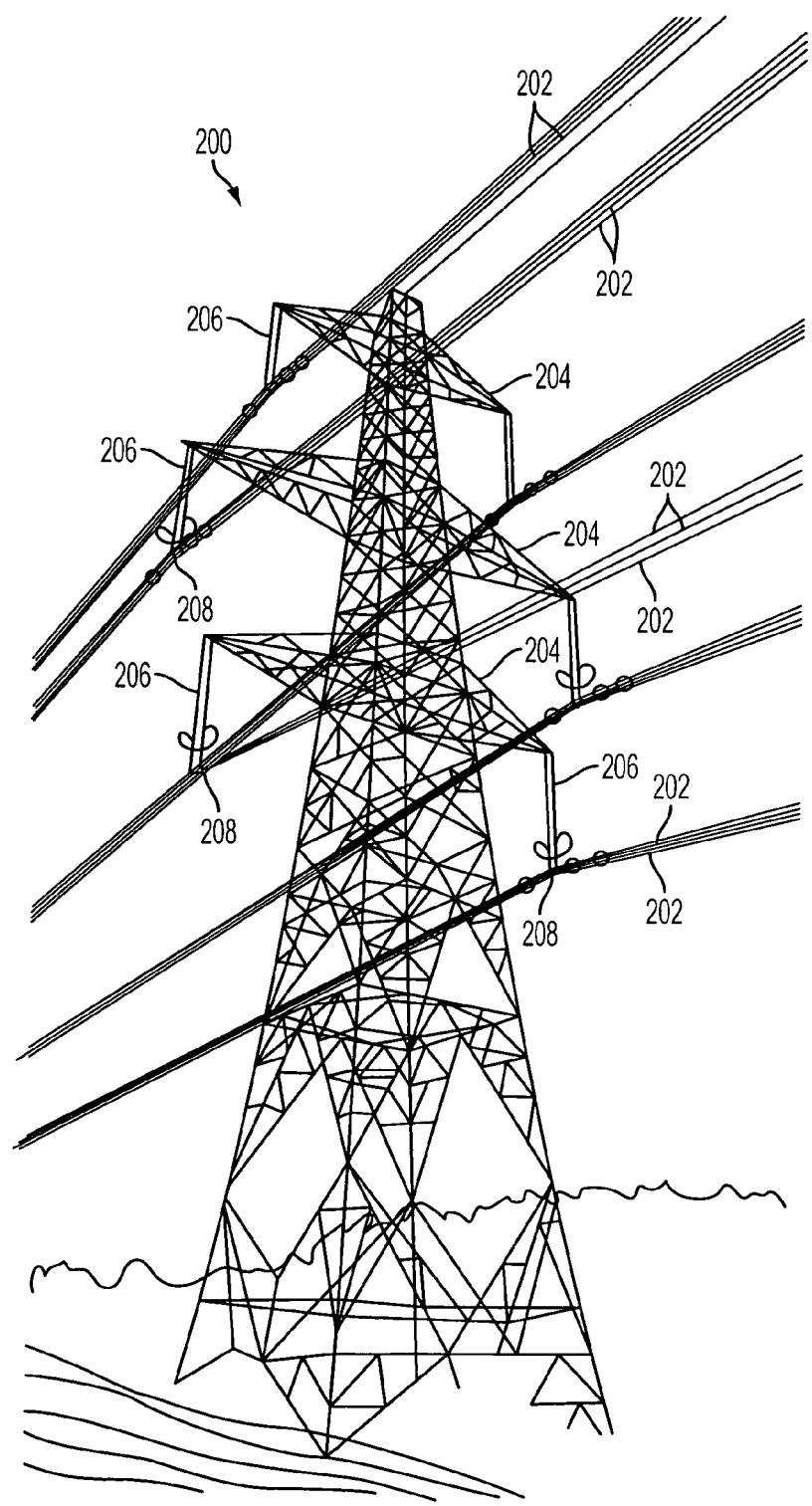
FIG. 1 is a perspective view of a transmission tower supporting transmission lines connected via suspension clamps.
Figure 2:
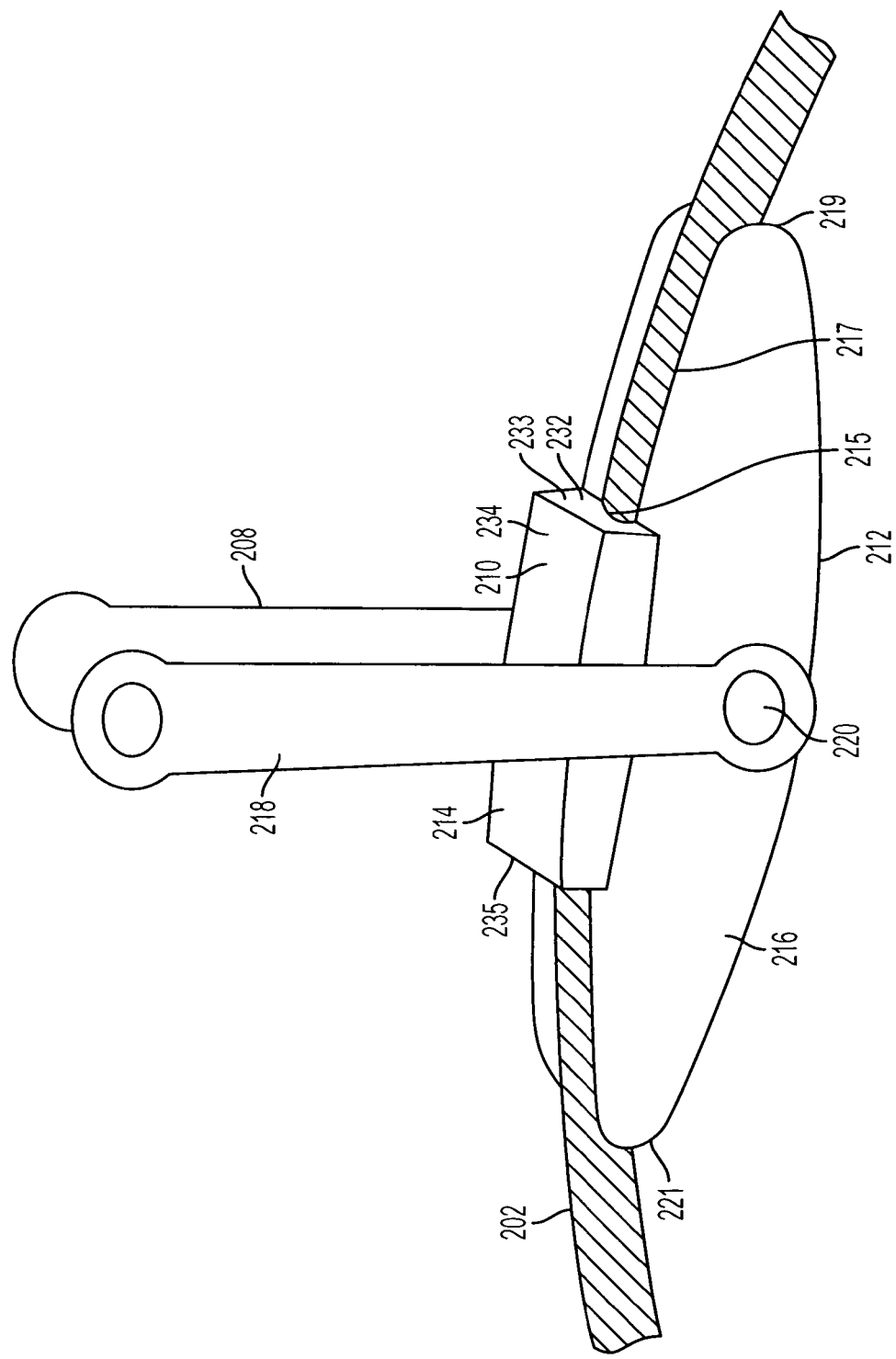
FIG. 2 is a perspective view of a suspension clamp.
Figure 3:
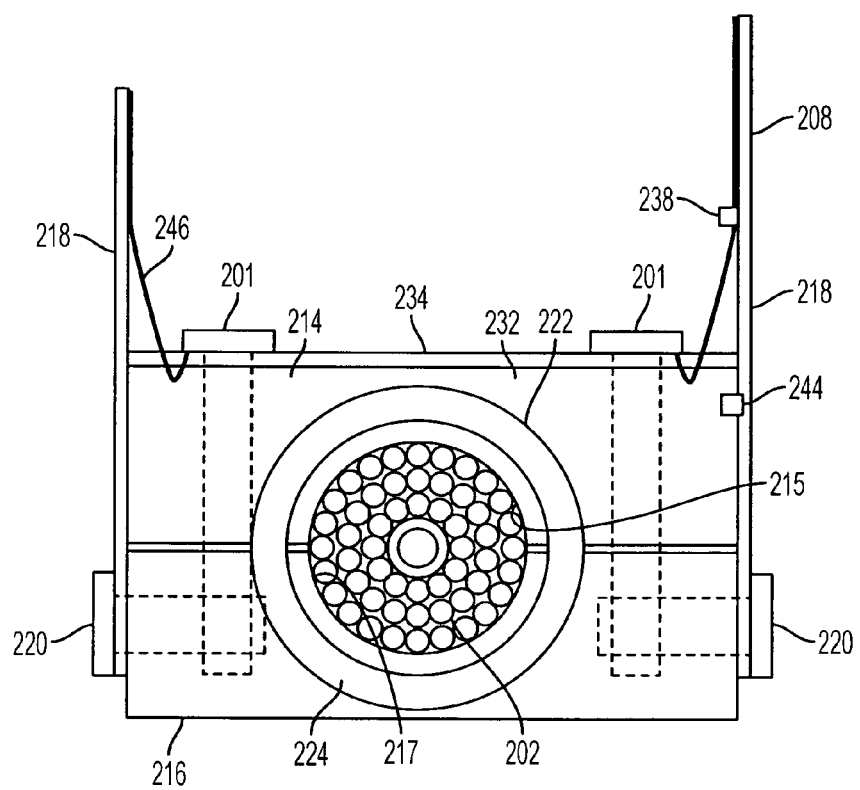
FIG. 3 is a cross section view of the suspension clamp shown in FIG. 2.
Figure 4:
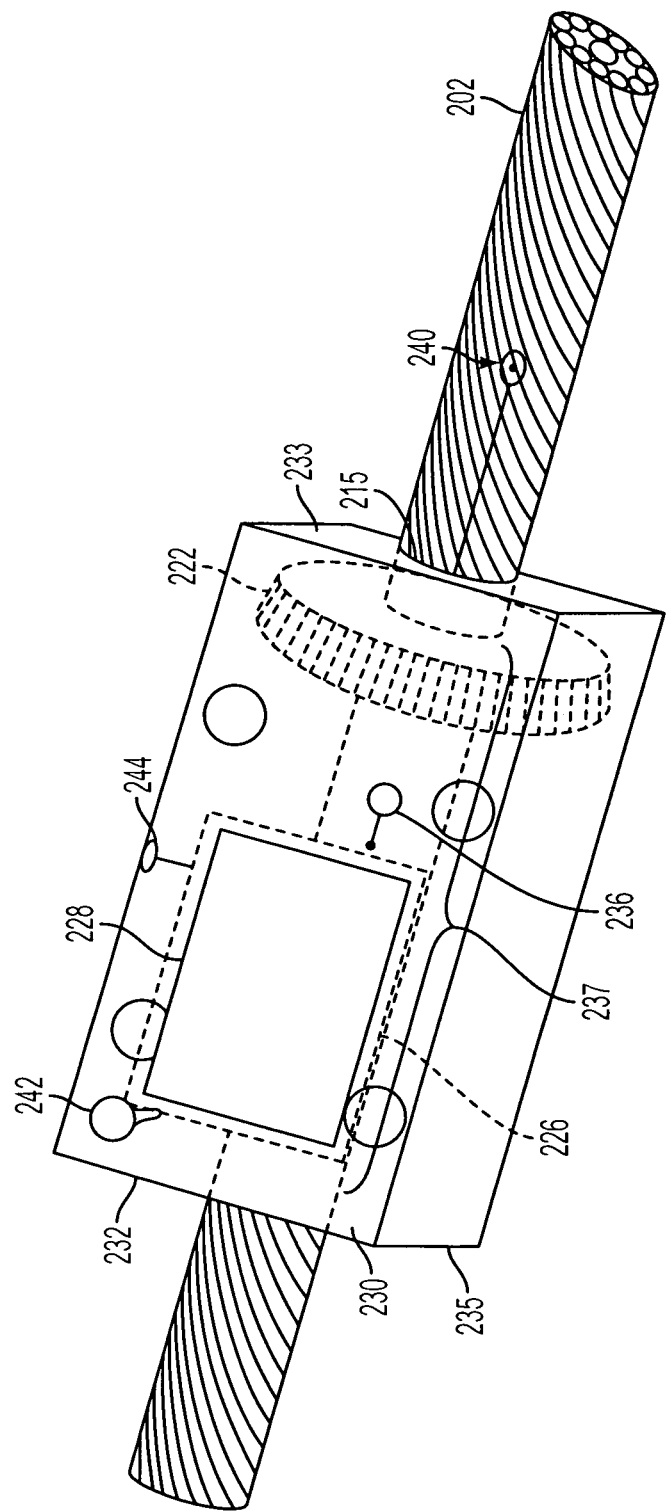
FIG. 4 is a perspective view of a first member of the suspension clamp shown in FIG. 2.

With continued reference to FIGS. 13*a* and 3*b*, an adaptor 710 can be mounted outside on a wall or a pole and be within, preferably, line of sight of a clamp 1. The adaptor 710 can be provided with a standard RJ45 10/100BT electrical Ethernet connection for ground-based network connections, and use 90 VAC to 264 VAC, 50 Hz or 60 Hz power and approximately 2 W. Other power connections, such as −48 Vdc, may be used. If a telco provides only a T1 (often called DS1) or E1 connection, standard Ethernet-to-T1 or E1 adaptors may be used to convert the adaptor 710 Ethernet signal to the telco T1 or E1 interface to establish a T1 or E1 private line from the adaptor site to the remote surveillance location 700. If neither a T1 or E1 private line nor a fully private network is used for the circuit between the adaptor 710 and the remote surveillance location or central station 700, a VPN network can be used to assure restricted access. The adaptor 710 includes sophisticated encryption to further address security concerns. In FIG. 13*b*, the hand off from the intermediate utility to the telco VPN can be T1, E1, DSL, cable modem, microwave hop to another site, among other methods. If the adapted connects the grid or network to a remote surveillance point or central station 700 by the internet, a gateway, firewall and VPN connection can be used for security reasons.

Each clamp 1 adaptor 710 has an integral web page server 560. One IP address is assigned at the remove surveillance point or central station 700 for each adaptor 710. For example, only one IP address need be assigned per adaptor 710, while an IP address for each clamp 1 does not need to be assigned. This IP address is programmed into the one or two adaptors 710 in a network. The adaptors 710 then automatically discover both the remote surveillance point or central station connection and all clamps 1 in the network as described above.

Surveillance personnel can then be provided with a browser address for accessing the remote adaptor 710. Once the browser address is entered, a private web page appears that provides access to the data from each clamp 1, longitude and latitude for each clamp which may be linked to a map, means to re-name clamps (Route 43 and Highway 22, for example), means to set thresholds (vibration, temperature etc.), and means to enter e-mail addresses that should be used to notify specific personnel if thresholds are crossed. The addresses can be clamp-specific in case the transmission lines span several maintenance regions. The number of e-mail alerts that are sent can be limited.

Thus, in accordance with an illustrative embodiment of the present invention, an administrative system is provided to facilitate monitoring and processing the collected data received from various data acquisition devices (e.g., a clamp 1). The administrative system can be implemented in processing devices used to aggregate and analyze the collected data such as an adaptor 710, central monitoring point 700, or a computing device with internet connectivity provided at a base station(s) or other locations. The administration system can use screens or web pages and web servers, which can be built-in. Firmware is provided to the data acquisition devices. Thus, no external software is needed.

Figure 16:
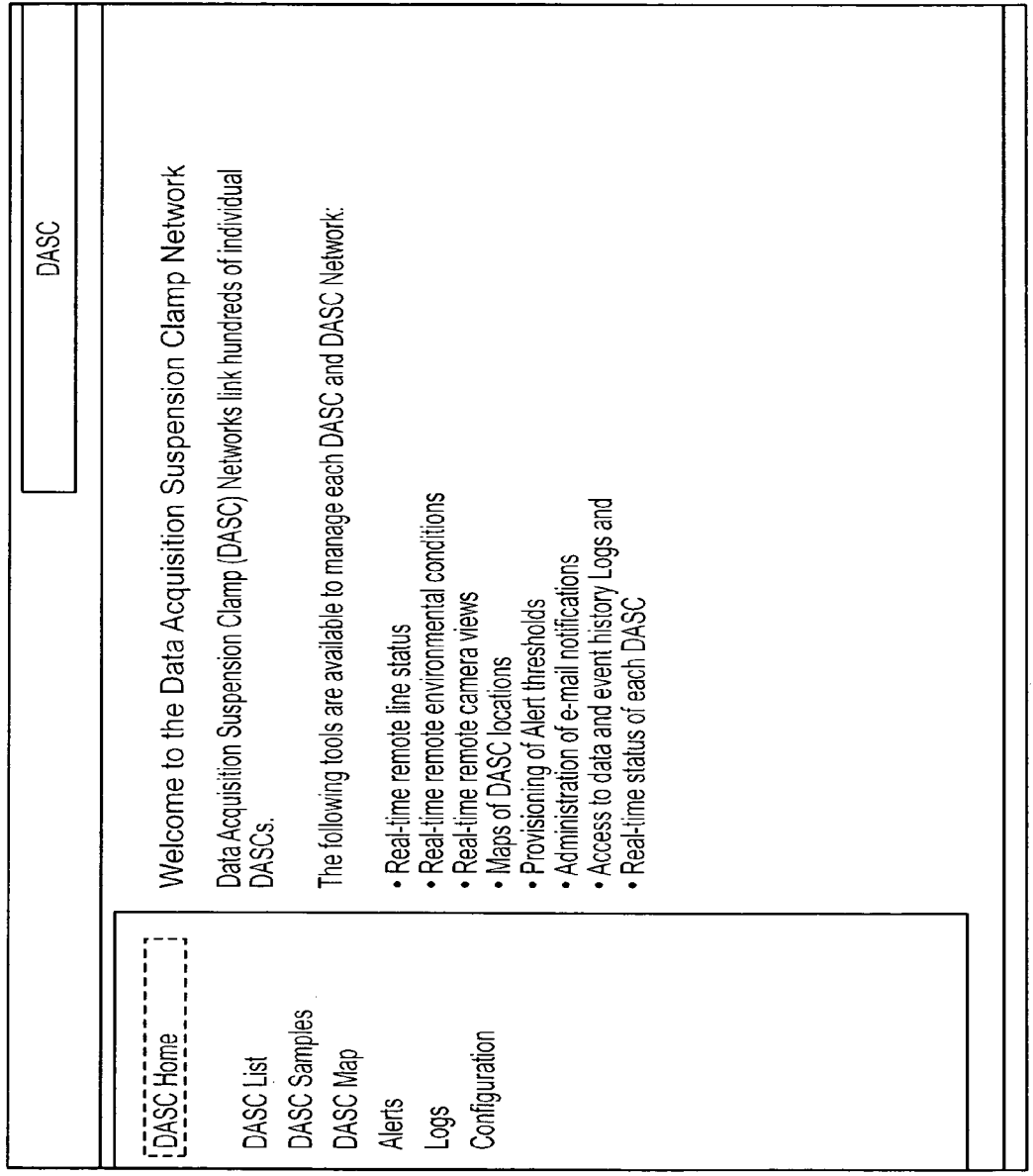

FIGS. 16 and 17 are illustrative web pages generated via the administrative system. A user (e.g., monitoring network administrator) is provided with an assigned Internet Protocol (IP) address with which to type into a web browser (e.g., Internet Explorer, Foxfire and the like) to navigate to the home page shown in FIG. 16. The home page provides a number of options for managing individual data acquisition devices and network(s) of data acquisition devices, that is, by selecting one of the options, a user can view system conditions as well as provision their device(s) and/or network(s). In the illustrated embodiment, the data acquisition devices are clamps 1 and referred to as Data Acquisition Suspension Clamps (DASCs). The IP address can be assigned to a base station, for example. A base station can be provided for each isolated network. By way of an example, selecting the DASC List option causes a screen or web page (not shown) to be provided to the user that lists DASCs by device identifiers. The user can then select one of the listed DASCs to navigate to a data page for that DASC as shown in FIG. 17.

With reference to FIG. 17, the data page indicates parameters for the selected DASC (e.g., clamp 1) and their corresponding dates/times or measurement which have been communicated to an aggregating device (e.g., adaptor 710) via the multi-hop radio communication system described above in connection with FIGS. 13-15. The parameters can be, but are not limited to, maximum and minimum ambient temperatures, maximum and minimum wind speeds, maximum and minimum current, maximum and minimum vibration, and maximum and minimum wire temperatures, among others. The data page 17 can also indicate events such as corona events and tilt events (e.g., number of and duration of such events as determined by deviations from conditions at the time of installation or upon a reset command to a particular smart clamp) and numbers of surge and impulse events, among others. Event history logs can be created based on this data, allowing a user to select the Logs option on the page depicted in FIG. 16 to view event histories.

With reference to FIG. 16, a user can select a DASC Samples option to navigate to a page (not shown) listing a number of available datasets. For example, a user can obtain a CSV file (i.e., comma separated values) upon by selecting one of the listed items.

With continued reference to FIG. 16, by selecting the DASC Map option on the home page, a user can be provided with a map showing the locations of data acquisition devices within a designated geographic area. The location coordinates can be collected by the administrative system and corresponding database either dynamically using the GPS device 510 provided in each of the data acquisition devices (e.g., via messaging) or pre-configured at the time the devices are installed or otherwise deployed.

For example, the integral GPS system 510 within each clamp 1 reports back its precise longitude and latitude. These data can be linked to, for example, utility-based mapping or, if suitable firewall and gateway safeguards are in place, Google maps. A typical Google map will show a pushpin for each clamp 1 location, include an ability to zoom in, and usually provide an ability to retrieve stored satellite images for the terrain in the vicinity of each clamp. If there is no direct connection between a smart grid network and Google maps, longitude and latitude information can be entered into Google maps manually on a separate network and the information used to establish a meaningful name for each clamp 1. Alternatively, the location can be entered into a proprietary map system already in use.

GPS positioning and DASC self-learning function can be provided in each data acquisition device 1 to permit DASC networks to evolve automatically. For example, a DASC 1 can be configured to obtain its position information and generate a location alert to a base station 700 and/or adaptor 710 at start up and/or periodically, in addition to sending parameter measurement. Thus, every new DASC 1 can be automatically recognized by a base station 700 and/or adaptor 710 with its location automatically determined such that corresponding data accumulation and reporting starts immediately and automatically after an initial deployment or restart. The administration system illustrated in connection with FIGS. 16 and 17 is advantageous because it provides a comprehensive view of transmission line conditions to enable confident dynamic line ratings (e.g., to help address peak and emergency demands), immediate and precise identification of line failures, proactive maintenance, diagnosis of recurring problems. The clamps 1 themselves communicate with one another which permits self-learning and awareness of long-term trends to help predictive maintenance.

By selecting an Alerts option on the home page depicted in FIG. 16, a user can access e-mail alerts that are automatically generated by the data acquisition devices 1 and transmitted to the base station 700 and/or adaptor 710 or other device implementing the administrative system. As stated above, data acquisition devices 1 can be configured to send alerts (e.g., e-mail messages or other type of transmitted signal alert) when measured parameters are outside a selected range or vary from a selected threshold by a selected amount. The Configuration option on the home page (FIG. 16) provides one or more pages (not shown) that enable a user to provision device(s) and/or network(s) of devices. For example, configuration pages can be provided that enable setting of parameter threshold deviations needed for automated alerts (e.g., a parameter exceeds a threshold be a selected amount or an event has occurred a selected number of times within a selected time period). The determination of such deviations can be performed at the data acquisition devices (e.g., via the CPU 505 on the main board 500 in accordance with the firmware). Alternatively, the data acquisition devices can merely report measurements of parameters to the base station or other monitoring location 710, 700, which instead makes the determination.

It is to be understood that other options and web pages are available. For example, the data page (FIG. 17) and/or home page (FIG. 16) can provide a link or navigation option to another page or a pop-up on the same page that provides the live camera view(s) for a selected DASC. For example, one or both views of the cameras in a clamp 1 (e.g., the respective views of oppositely extending sections of the monitored line 30) can be provided to allow a user to make a visual assessment of whether sag or galloping is occurring or to otherwise assess damage to a line (e.g., icing, mechanical failure of the line or tower, and so on). Image processing can also be provided (e.g., at the base station or other monitoring station) to automatically assess images provided by the cameras (e.g., comparing different images) to determine whether certain conditions are present (e.g., sag) and to automatically generate alerts as needed.

As described above and in accordance with illustrative embodiments of the present invention, a clamp 1 or other data acquisition device configuration can be provided with one or more sensors for monitoring selected transmission line 30 conditions including, but not limited to ambient temperature, conductor temperature, wind speed perpendicular to the line (e.g., measurement is done without moving parts to assure long-term quality and reliability), vibration, current amplitude, current quality (e.g., harmonic distortion), current surges, precise location via GPS, precise timing via the GPS, transient or surge location via precision time stamping and automatic clamp-to-clamp communications, corona, tilt changes (e.g., as measured by the clamp's 3-axis accelerometer), sag changes (e.g., as displayed by a pair of integral clamp 1 cameras that look down both directions of the line 30), galloping (e.g., as detected by the vibration sensor and seen by the cameras), local conditions (e.g., via still visual images in both directions of the line 30 to help detect icing or mechanical failure of the line or tower, internal operation via continuous self diagnosis (e.g., as programmed into the CPU 505), operating conditions of neighboring clamps on other phases, and so on.

Thus, the data acquisition device (e.g., clamp 1) provides an unprecedented ability to integrate transmission line operating conditions in real-time. Rather than piecemeal visibility at a single location or reliance upon inferred data such as sag to estimate line temperature, new Dynamic Line Rating capabilities and visibility are made possible by the clamps that delivers precise mile-by-mile data that can be integrated and used to dynamically vary line 30 loading with confidence. Risks associated with dependence upon a few data points can be dramatically reduced and replaced by a Dynamic Line Rating based upon (a) precise real-time wind speed determination that automatically measures the cooling effect of wind perpendicular to the line; (b) precise total current measurements made along a line 30 to uncover varying parasitic losses and other issues that limit capacity; and (c) wide-bandwidth current measurements in real-time. Wide-bandwidth current measurements reveal harmonics that waste energy and increase heating. These real-time data can then be used to optimize network operation and uncover associated stresses to components such as transformers.

As stated above, another advantage of the data acquisition device (e.g., clamp 1) constructed in accordance with an illustrative embodiment of the present invention is self-powering. The clamp 1 includes an integral or associated current transformer 330 which provides all necessary power. No batteries or connection to external power is required. Energy storage without batteries is also provided (e.g., a capacitor(s)) to support final messages should a line 30 fail. The clamp 1 therefore can continue to operate (e.g., for several seconds) to provide final reports.

As described above, wireless communications are established between the clamps 1 and between a clamp array (e.g., as illustrated in FIGS. 13-15) and a substation or other convenient ground location 710. Data is then communicated over a private or public network to surveillance locations 700. The multi-hop radio communications described herein in accordance with an illustrative embodiment of the present invention provide resilient communications. Failure of a clamp 1 for any reason is detected and reported by neighboring clamps without disrupting end-to-end communications. Further, the communications are secure. Security similar to that used for on-line banking transactions is utilized along with other measures to help assure network integrity as described above in accordance with an illustrative embodiment of the present invention.

The integral GPS 510 provides precise timing and automatically locates each clamp 1. An integral web browser 560 dramatically simplifies data acquisition via web page selection of thresholds, alerting e-mail addresses and comprehensive display (e.g., of up to 7 days of accumulated data).

There are several ways to utilize data collected by a network. A few shall now be discussed for illustrative purposes.

Flexible reporting is achieved by reports and images that appear as web pages (i.e. HTML files). The basic files display collected data in a series of tables on multiple pages. If a different presentation or appearance of the data is preferred, the system permits new HTML files to be uploaded to each clamp. Each clamp 1 is operated independently and can have its own unique HTML files. This may appear overly complicated initially, but larger arrays that span multiple transmission facilities can benefit from this ability to optimize the presentation of data to fit varying circumstances.

Fault or alarm conditions are immediately reported via e-mail. Each incident can then be investigated further via the report and image pages.

A web-based form is provided to set alarm or warning limits for various parameters such as maximum current, current surge, maximum conductor temperature, or maximum vibration. Local conditions such as corona can be set to trigger an e-mail or be ignored. The form also permits entry of e-mail addresses for notifications and a means to limit the number of e-mails each clamp 1 can send in an hour.

When a fault occurs, the network can identify what the problem was and the area where the problem occurred in accordance with illustrative embodiments of the present invention. E-mails can be sent to first responders so that a team can be dispatched (or not) based upon real-time site data. Time is saved, dispatched crews may be able to bring appropriate repair equipment, repair progress can potentially be witnessed and the repairs can be monitored.

Illustrative embodiments of the present invention also improve upon finding stressed or compromised facilities.

Excessive temperature, tilt and other factors can lead to a failure. Knowing that lines are compromised enables proactive maintenance to prevent outages. With regard to finding and monitoring vibration problems, dampers are deployed to limit the vibration. Although real-world damper effectiveness has been demonstrated and they work well in many applications, real-time effectiveness based upon wind and tower conditions can now be monitored to optimize effectiveness and uncover unknown or suspected issues.

The illustrative embodiments of the present invention allow maximizing capacity. Transmission facilities have conventionally been designed for worst-case conditions. In some instances, a 25% safety margin has been used to assure resiliency. Knowing real-time wind and temperature conditions in accordance with illustrative embodiments of the present invention can permit loads to be safely increased during peak periods or when another segment is out of service.

The illustrative embodiments of the present invention provide cascade failure analysis. A cascade failure occurs when one element breaks and causes several other network elements to fail unexpectedly. For transmission lines 30, most recorded observations are limited to measurements at substations or originating points. The distributed intelligence available from a smart clamp network helps the understanding of such a failure, what precipitated it and how to engineer improvements for existing and future lines.

The illustrative embodiments of the present invention improve network planning. Detailed knowledge of operating conditions permits better forecasting of transmission line requirements and aids justification of new construction.

Illustrative embodiments of the present invention provide a smart grid system, method and apparatus that measure the conductor temperature to provide feedback on the actual capacity, as well as other information, of a transmission line 30 (e.g. a power transmission line) at many points. The power transmission line may be overstressed, but it could have more capacity than that which is actually being used. The illustrative system of the present invention can measure the wind speed and ambient temperature to determine the conditions along a power transmission line that may be hundreds of miles long. Some parts of the wire of the power transmission line may be warmer than other parts because the power transmission line may run through a valley where there is no wind, for instance, or due to other reasons. For example, an anemometer with no moving parts can be used to determine the cooling effect of the wind.

The smart grid system is able to detect corona, even when it is intermittent, using audio detection of corona. The smart grid system is able to measure the current in the line. If it is determined that the measured current is different than the current launched at a substation, there is a current leak or fault somewhere. The smart grid system is able to take a picture of the power transmission line and its surroundings in order to visualize any ice, fallen trees, vegetation, and the like growing on the power transmission line, as well as sagging power transmission lines, or even wildlife that may damage the power transmission lines and smart grids.

The smart grid system can quickly determine if there is an immediate or long term problem in the power transmission line and communicate to a user/technician. The smart grid system is easy to install, very robust, simple to administer, and does not require regular maintenance, such as replenishing or recharging batteries. In addition, the system is cost effective and secure. The integrated web server in the smart grid data acquisition device simplifies and reduces the cost of backend software. An improved radio protocol and routing algorithms are provided which are particularly well suited for long runs with modest branching; however, they can be used for more general applications where Zigbee and Zigbee-type technologies lack range or capacity.

The above-described exemplary embodiments of an apparatus, system and method in computer-readable media include program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. The media may also be a transmission medium such as optical or metallic lines, wave guides, and so on, and is envisioned include a carrier wave transmitting signals specifying the program instructions, data structures, and so on. The computer-readable recording medium can also be distributed over network-coupled computer systems so that the computer-readable code is stored and executed in a distributed fashion. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A data acquisition device for acquiring data from a transmission line comprising:
at least one sensor for determining at least one of a parameter and image associated with the transmission line;
a radio interface for communicating to at least one of a monitoring device and a neighboring data acquisition device via a radio communication link within a selected range; and
a processing device connected to the at least one sensor and the radio interface, the processing device being programmed to receive and process inputs from the at least one sensor, and to generate messages for transmission via the radio interface;
wherein the processing device is configured to participate in multi-hop communications via the radio communication link by receiving messages generated by other data acquisition devices, and determining from information provided in each of the messages which operation to perform from among process the message, repeat the message, and ignore the message;
wherein a network comprises a plurality of the data acquisition device, each of the data acquisition devices being assigned a unique address, the processing device being configured with a self-assembling process that automatically configures the data acquisition device to communicate within the network of other data acquisition devices and the monitoring device by receiving a configuration message transmitted from the monitoring device via the radio communication link, repeating the configuration message via the radio communication link, sending a reply message comprising its corresponding address via the radio communication link in response to the configuration message, receiving reply messages sent from other ones of the data acquisition devices, each of the reply messages comprising the corresponding address of the data acquisition device that generated it, and determining from the reply messages the corresponding address of each of the data acquisition devices within its selected range;

wherein each of the data acquisition devices in the network is configured to perform the self-assembling process to create a table comprising the unique addresses of the data acquisition devices in its selected range;

wherein the unique address of each of the data acquisition devices is a Media Access Control (MAC) address, the radio interface in each of the data acquisition devices is a ZigBee radio interface customized to employ the self-assembling process that assembles each of the data acquisition devices into a communication network that obviates manual configuration of the radio interface in each of the data acquisition devices, each of the data acquisition devices being configured to automatically generate the table with the MAC addresses of selected ones of the other data acquisition devices in its selected range.

2. A data acquisition device as recited in claim 1, wherein the information provided in each of the messages comprises a number of hops corresponding to the number of times the message has been repeated by one of the data acquisition devices following its origination, the processing device being configured to increment the number of hops in each of the messages before it is repeated.

3. A data acquisition device as recited in claim 2, wherein the processing device is configured to determine whether to repeat the message based on the number of hops and the address included in the message.

4. A data acquisition device as recited in claim 1, wherein the configuration message is repeated, and the processing device dynamically updates information relating to the data acquisition devices based on the reply messages to the configuration message and stores the information in a memory device.

5. A data acquisition device as recited in claim 4, wherein the processing device can configure the information in the memory device upon power up and obviate pre-configuration.

6. A data acquisition device as recited in claim 1, wherein the data acquisition device further comprises a radio-to-ground communications interface for communicating with the monitoring device, the processing device being configured to aggregate data about the other data acquisition devices from messages received from the other data acquisition devices via the radio communication link and provide the data to the monitoring device via the radio-to-ground communications interface.

7. A data acquisition device as recited in claim 1, wherein the radio interface is assigned an encryption key dynamically.

8. A data acquisition device as recited in claim 1, wherein the data acquisition device further comprises a web server, the processing device being configured to send the message via email.

9. A data acquisition device as recited in claim 1, wherein the monitoring device is assigned an Internet Protocol address and configured to provide a user with a Hypertext Markup Language (HTML) page corresponding to the data acquisition device that comprises the at least one of a parameter and image obtained from the sensor.

10. A data acquisition device as recited in claim 1, wherein each of the data acquisition devices comprises a corresponding Hypertext Markup Language (HTML) page.

11. A data acquisition device as claimed in claim 1, wherein the transmission line is a power transmission line and further comprising a power supply for the data acquisition device comprising a current transformer connected to the transmission line and configured to extract power from a magnetic field generated by current in the transmission line and provide direct current (DC) power to components in the data acquisition device.

12. A data acquisition device as recited in claim 1, wherein the data acquisition device further comprises an audio corona detector having a microphone and a processor comprising at least one of the processing device and a processor associated with the audio corona detector, the processor being configured to obtain audio inputs due to respective corona events from the microphone, to process the audio inputs to generate corresponding audio signatures representing the corona events, and to compare at least parts of the audio signatures with selected threshold characteristics.

13. A data acquisition device as claimed in claim 12, wherein the processor is configured to sample an output of the microphone at least one of continually, periodically, and at selected times to obtain the audio inputs.

14. A data acquisition device as claimed in claim 12, wherein the processor is configured to generate an alert if one of the audio signatures differs from at least one of the selected threshold characteristics by a selected amount.

15. A data acquisition device as claimed in claim 1, wherein the sensor comprises an ambient temperature sensor and an anemometer for determining wind speed using a measured ambient temperature from the ambient temperature sensor and a reference temperature.

16. A data acquisition device as claimed in claim 1, wherein the data acquisition device comprises a housing having a longitudinal axis that is parallel to a longitudinal axis of the transmission line, the housing comprising a first end that is heated to a reference temperature by a heating element, and a second end enclosing an ambient temperature sensor, the processing device being programmed to determine wind speed using the difference between a measured ambient temperature and the reference temperature.

17. A data acquisition device as claimed in claim 1, wherein the data acquisition device is configured to store a table comprising the unique addresses corresponding to a limited number of the data acquisition devices in the network.

18. A data acquisition device as claimed in claim 1, wherein the ZigBee radio interface in each of the data acquisition devices is customized to be dynamically assigned an encryption key.

* * * * *